United States Patent
Ahopelto et al.

(10) Patent No.: US 10,410,798 B2
(45) Date of Patent: Sep. 10, 2019

(54) BLANK SUITABLE FOR USE AS A BODY OF A SUPERCAPACITOR, A SUPERCAPACITOR, AND A METHOD OF MANUFACTURING A POROUS SILICON VOLUME

(71) Applicant: Teknologian tutkimuskeskus VTT Oy, Espoo (FI)

(72) Inventors: Jouni Ahopelto, Espoo (FI); Grigoras Kestutis, Espoo (FI); Leif Grönberg, Espoo (FI); Mika Prunnila, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 0 days.

(21) Appl. No.: 15/518,774

(22) PCT Filed: Oct. 14, 2015

(86) PCT No.: PCT/FI2015/050692
§ 371 (c)(1),
(2) Date: Apr. 13, 2017

(87) PCT Pub. No.: WO2016/059296
PCT Pub. Date: Apr. 21, 2016

(65) Prior Publication Data
US 2017/0229252 A1  Aug. 10, 2017

(30) Foreign Application Priority Data
Oct. 17, 2014 (FI) ..................................... 20145914

(51) Int. Cl.
*H01G 11/08* (2013.01)
*H01G 11/26* (2013.01)
(Continued)

(52) U.S. Cl.
CPC ........... *H01G 11/26* (2013.01); *H01G 9/0032* (2013.01); *H01G 9/055* (2013.01); *H01G 9/07* (2013.01);
(Continued)

(58) Field of Classification Search
CPC .... H01G 11/26; H01G 11/0029; H01G 11/04; H01G 11/84; H01G 11/30; H01G 11/08
See application file for complete search history.

(56) References Cited

U.S. PATENT DOCUMENTS 5,229,318 A * 7/1993 Straboni ............. H01L 21/3185
148/DIG. 50
5,508,542 A * 4/1996 Geiss ................. H01L 27/10861
257/301

(Continued)

FOREIGN PATENT DOCUMENTS

KR      20140068108 A    6/2014
WO   WO2013112670 A1    8/2013
(Continued)

OTHER PUBLICATIONS

Grigoras et al., "Porous silicon electrodes for high performance integrated supercapacitors", Electronics System-Integration Technology Conference (ESTC), Sep. 18, 2014.
(Continued)

*Primary Examiner* — Nguyen T Ha
(74) *Attorney, Agent, or Firm* — Seppo Laine Oy

(57) ABSTRACT

A blank suitable for use as a body of a supercapacitor comprises a first porous semiconductor volume and a second porous semiconductor volume, the second porous semiconductor volume laterally surrounded by the first porous semiconductor volume and separated from it by a trench that is suitable for receiving an electrolyte, whereby the first and second porous semiconductor volume comprise channels
(Continued)

opening to the trench. A supercapacitor comprises a body formed by using the blank according to any one of the preceding claims, so that the first porous semiconductor volume acts as one electrode and the second porous semiconductor volume acts as another electrode, with an electrolyte in the trench.

16 Claims, 26 Drawing Sheets

(51) Int. Cl.
*H01G 11/74* (2013.01)
*H01G 9/00* (2006.01)
*H01G 9/055* (2006.01)
*H01G 9/07* (2006.01)
*H01G 11/30* (2013.01)
*H01G 11/86* (2013.01)
*H01L 49/02* (2006.01)
*H01L 23/522* (2006.01)

(52) U.S. Cl.
CPC .......... *H01G 11/08* (2013.01); *H01G 11/30* (2013.01); *H01G 11/74* (2013.01); *H01G 11/86* (2013.01); *H01L 28/40* (2013.01); *H01L 23/5223* (2013.01); *Y02E 60/13* (2013.01)

(56) References Cited

U.S. PATENT DOCUMENTS

| | | |
|---|---|---|
| 7,161,228 B1 | 1/2007 | Pettit |
| 8,816,465 B1* | 8/2014 | Gardner ............... H01L 31/053 257/461 |
| 9,093,226 B2* | 7/2015 | Gardner ............... H01G 11/26 |
| 2004/0124439 A1* | 7/2004 | Minami ........... H01L 21/76289 257/200 |
| 2006/0258037 A1 | 11/2006 | Fischer et al. |
| 2007/0048589 A1 | 3/2007 | Koripella et al. |
| 2009/0235982 A1* | 9/2009 | Okada ............... H01G 9/2031 136/256 |
| 2010/0221606 A1 | 9/2010 | Nalamasu et al. |
| 2012/0231326 A1 | 9/2012 | Sibani et al. |
| 2014/0078644 A1* | 3/2014 | Gardner ............... H01G 11/26 361/502 |

FOREIGN PATENT DOCUMENTS

| | | |
|---|---|---|
| WO | WO2013126050 A1 | 8/2013 |
| WO | WO2013128082 A1 | 9/2013 |
| WO | WO2013162546 A1 | 10/2013 |
| WO | WO2014042750 A1 | 3/2014 |

OTHER PUBLICATIONS

Oakes et al., "Surface engineered porous silicon for stable, high performance electrochemical supercapacitors", Scientific Reports 3:3020, Oct. 22, 2013.

* cited by examiner

BLANK SUITABLE FOR USE AS A BODY OF A SUPERCAPACITOR, A SUPERCAPACITOR, AND A METHOD OF MANUFACTURING A POROUS SILICON VOLUME

BACKGROUND OF THE INVENTION

Generally, the invention relates to the field of semiconductors and microelectronics. More particularly, certain aspects of the invention relate to semiconductor-based supercapacitors while certain aspects of the invention relate to manufacture of porous semiconductors.

High surface area carbon based materials, e.g. activated carbon, carbide derived carbon, carbon nanotubes or graphene, are typically used as supercapacitor electrodes.

Especially, the low cost activated carbon has found large scale application in commercial supercapacitors. The carbon material is usually applied on the current collector using polymeric binders and different coating processes.

However, as these processes are difficult to miniaturize and integrate to microelectronic manufacturing processes, alternative microfabrication and nanofabrication processes have recently been proposed. Promising fabrication methods include, e.g., production of high surface area carbon from common photoresist materials, the so-called photoresist derived carbon, and partial reduction of graphite oxide, which can be produced by laser reduction at microscale.

Specific capacitance of 2.35 $Fcm^{-3}$ for laser patterned graphene oxide/reduced graphene oxide (GO/RGO) microcapacitor was obtained, with extremely stable operation. The production and deposition of graphite oxide films remain issues to be solved before commercialization. Devices with silicon carbide-derived carbon films have been also demonstrated with capacitance up to 0.7 $mFcm^{-2}$, what is comparable to CNT based electrodes. One drawback of this technique is the high processing temperature—the graphitization was performed at 1050° C.

International patent application of Intel Corporation published under publication number WO 2011/123135 A1 discloses a charge storage device. The charge storage device includes a first and a second electrically conductive structure separated from each other by a separator. The first and the second electrically conductive structure include a porous structure containing multiple channels. Each of the channels has an opening to a surface of the porous structure.

International patent application of the present applicant published under publication number WO 2013/128082 A1 discloses an integrable electrochemical capacitor and methods for manufacturing the same. The electrochemical capacitor comprises a first electrode comprising a first rigid piece having a first porous portion, a second electrode comprising a second rigid piece having a second porous portion, and an electrolyte in contact with the first porous portion and the second porous portion. The structure allows the electrochemical capacitor to be manufactured without a separator film between the electrodes.

OBJECTIVE OF THE INVENTION

The use of silicon as micro supercapacitor material has received so far surprisingly little attention although it can be etched into high surface area nanoporous structure. Use of porous Si (PS) directly as the electrode material could facilitate easy integration into existing fabrication processes.

Unfortunately, silicon is electrochemically instable in common electrolytes, has limited wettability and exhibits poor electrical conductivity—properties that lead to weak overall electrical performance of PS supercapacitors. Coating of PS has been broadly recognized as an attractive route to reduce the resistance and increase the stability, but even for coated electrodes the performance has still been several orders of magnitudes below that of carbon based on-chip supercapacitors, because in the end the power density is detrimentally limited by the resistance of the complex Si nanostructure.

The integrable electrochemical capacitor disclosed in WO 2013/128082 A1 is rather difficult to manufacture.

The charge storage device disclosed in WO 2011/123135 A1 is also, if operable at all, rather difficult to implement.

Furthermore, the design that is necessary for laterally constraining the electrolyte inside the electrochemical capacitor or the charge storage device has proven to be challenging to implement. Sealing the ends of the trench may sometimes be quite difficult.

The porous semiconductor channels in the trench are also difficult to make. Even though the trench can be made in the manner proposed in WO 2013/128082 A1, while the side surfaces of the silicon-on-insulator (SOI) wafer are being treated by hydrogen fluoride based etching liquid to generate a mesoporous surface structure in the SOI, hydrogen fluoride reacts so intensively with the insulator layer that the insulator layer disappears due to the effect of the etching liquid. In consequence, it is difficult if not impossible to utilize the insulator layer as a carrier structure for the supercapacitor. Were the insulator layer intact, it might be possible to use the silicon-on-insulator wafer also for other purposes.

An objective of the first aspect of the invention is to simplify the manufacturing of a supercapacitor or a blank suitable for use as a body of a supercapacitor. This objective can be met with the blank according to independent claim 1, or with a supercapacitor according to parallel independent claim 13.

An objective of the second aspect of the invention relates to improving formation methods of porous silicon. This objective can be met with the method of manufacturing a porous silicon volume according to claim 17, and with the self-limiting etching method according to claim 18, and with the porous silicon shaping method.

An objective of the third aspect of the invention is to improve the manufacturing method of porous semiconductor channels. This objective can be met by using the first, second or third method for selectively forming porous semiconductor channels.

An objective of the fourth aspect of the invention relates to the method of using the novel PS-TiN hybrid material in a silicon nanostructure, in particular in a micro-supercapacitor. This objective can be met with the method of using porous silicon (PS)-TiN hybrid material fabricated by electrochemical etching of bulk silicon into nanoporous silicon and subsequent highly conformal atomic layer deposition coating of TiN in a silicon nanotructure, in particular to manufacture a micro-supercapacitor.

An objective of the fifth aspect of the invention relates to manufacturing electrodes in a silicon structure, such as that may be used in a blank or a supercapacitor according to any one of the other aspects of the invention. This objective can be met with the method of manufacturing electrodes in a silicon structure.

The dependent claims describe various advantageous aspects of the blank, supercapacitor, and of the methods.

Advantages of the Invention

The blank suitable for use as a body of a supercapacitor comprises a first porous semiconductor volume and a second porous semiconductor volume. The second porous semiconductor volume is laterally surrounded by the first porous semiconductor volume and separated from it by a trench that is suitable for receiving an electrolyte. The first and second porous semiconductor volume comprise channels opening to the trench.

A great advantage is that the ends of the trench do not need to be closed (i.e. the trench does not need to be closed laterally) any more since the first porous semiconductor volume laterally surrounds the second porous semiconductor volume. So the trench advantageously may (but does not need to) form a closed form, such as loop, circle, it may be rectangular or have any shape. It is important is that the porous semiconductor volumes on the opposite sides of the trench are electrically isolated from each other so that the electrodes of the supercapacitor will not be short-circuited.

When the first porous semiconductor volume and the second porous semiconductor volume are in the same semiconductor layer and extend throughout the height of the layer, the closing of the blank from the top of the trench can be made easier. But even better, in this manner, the whole height of the semiconductor wafer volume can be utilized thus facilitating further miniatuarization of the semiconductor devices.

When the trench-side edge of the first porous semiconductor volume and the trench-side-edge of the second porous semiconductor volume each form at least one electrode, electrical connections to the blank (or later to the supercapacitor) can be carried out at a well-defined location.

When at least one, both or all of the electrodes has/have been at least partially coated on the respective edges, the stability of the supercapacitor can be improved while maintaining a relatively high capacitance density. Most advantageously, the coating can be carried out by using atomic layer deposition or any other method for producing conformal layers, for example by using TiN or NbN or material, compound or alloy comprising TiN or NbN. TiN has a sufficiently high conductivity and is electrochemically sufficiently stable. In addition to this or alternatively, the coating may be or comprise an electrically conducting oxide or metal.

We have tested prototypes of the blank in which the first porous semiconductor volume and the second porous semiconductor volume are or comprise silicon to show a relatively good stability.

When the blank further comprises an insulating layer limiting to the bottom of the first porous volume and of the second porous volume, and to the bottom of the trench, the sealing of the electrolyte also from bottom of the trench can be obtained by the structure and therefore no subsequent sealing steps are necessary at the bottom of the trench.

Most advantageously, the insulating layer is or comprises a buried oxide layer and/or consists of semiconductor oxide. Semiconductor oxides can be combined with semiconductors.

Advantageously, the blank may be in a single or double side polished silicon wafer that is a silicon-on-insulator wafer comprising a silicon-on-insulator layer, and located on the opposite side of the silicon-on-insulator layer. Preferably, the blank is in an n++ or p++ doped layer of the single or double side polished silicon wafer. The blank can be in a single or double side polished silicon wafer with an insulating layer covering the other side of the wafer. Preferably, the blank is in an n++ or p++ doped layer of the single or double side polished silicon wafer. In a SOI wafer, the insulator in the BOX layer can be nitride instead of silicon dioxide.

In our prototypes we did use such n++ or p++ doped silicon-on-insulator wafers where the insulator is or consists of $SiO_2$. If the $SiO_2$ layer is in the middle layer, the first and the second porous volume could be formed on any side of the wafer. However, the n++ or p++ doped silicon layer lower (substrate or handle wafer) side of the wafer is usually much thicker than the silicon layer of the SOI layer. Therefore, if the substrate side is used for the blank (or for the supercapacitor), the porous volumes can be made much larger thus increasing the capacitance obtainable.

The supercapacitor according to the invention comprises a body formed by using a blank with an electrolyte in the trench. The first porous volume acts as one electrode and the second porous volume acts as another electrode. After the electrolyte has been inserted, the trench is most preferably covered by a suitable cover.

When the supercapacitor further comprises electrical contacting points to the electrodes that have been made through a layer that is immediately below the trench, the contacting can be made from below of the supercapacitor. In this manner, the layer below the trench can act as a reinforcement for the supercapacitor. Furthermore, if the layer below the trench is a buried oxide (BOX) layer and if there is a silicon-on-insulator (SOI) layer on the BOX layer on the opposite side of the BOX layer, not only the contacting of the supercapacitor can be made in a convenient manner but the SOI layer can be used for manufacturing other components integrated to the supercapacitor component.

Most advantageously, the supercapacitor is a separatorless supercapacitor in which there is no intervening separator or separator in the trench but the trench itself acts as a separator. In this manner, the inserting of a separate intervening separator or a separator into the trench can be avoided. This may result in less manufacturing cost and/or in smaller volume of the supercapacitor.

The first method of selectively forming porous semiconductor channels opening to a trench comprises the steps of:
  etching a partial trench in a semiconductive semiconductor layer of a semiconductor wafer comprising the at least one semiconductive semiconductor layer and at least one buried oxide layer and/or at least one layer consisting of semiconductor oxide and/or at least one electrically isolating layer such as silicon nitride layer, the etched silicon layer limiting to the buried oxide layer, to the semiconductor oxide layer, or to the electrically isolating layer,
  by using hydrogen fluoride (HF) based etching liquid, such as HF:ethanol, HF:water, HF:water:ethanol, HW:isopropanol, HF:water:isopropanol, and/or with other additives, in a suitable concentration, in particular 1:1, 1:2, 1:4 or any other concentration
  whereby the etching is carried out at least partly simultaneously by applying an electrical field over the semiconductor wafer
  so that porous semiconductor channels opening to the trench are formed;
  removing the hydrogen fluoride based etching liquid;
  etching the trench deeper by means of plasma etching until the buried oxide layer, the semiconductor oxide layer or the electrically insulating layer is reached.

The second method of selectively forming porous semiconductor channels opening to a trench that is an alternative to the first method comprises the steps of:
  etching a partial trench in a semiconductive semiconductor layer of a semiconductor wafer comprising at least one semiconductor layer and at least one buried oxide layer, at least one layer consisting of semiconductor dioxide, or at least one electrically insulating layer which in particular may be a silicon nitride layer, the etched semiconductor layer limiting to the buried oxide layer, to the semiconductor oxide layer, or to the electrically insulating layer,
by using plasma etching,
applying to the partial trench hydrogen fluoride (HF) based etching liquid, such as HF:ethanol, HF:water, HF:water:ethanol, HW:isopropanol, HF:water:isopropanol, and/or with other additives, in a suitable concentration, in particular 1:1, 1:2, 1:4 or any other concentration, at least partly simultaneously to applying an electrical field over the semiconductor wafer so that porous semiconductor channels opening to the trench are formed;
removing the hydrogen fluoride based etching liquid;
etching the trench deeper by means of plasma etching until the buried oxide layer, the semiconductor oxide layer, or the electrically insulating layer is reached.

The third method of selectively forming porous semiconductor channels opening to a trench that is an alternative to the first and the second methods comprises the steps of:
etching a trench in a semiconductive semiconductor layer of a semiconductor wafer comprising the at least one semiconductive semiconductor layer and at least one buried oxide layer or at least one layer semiconductor dioxide or at least one electrically insulating layer which is a silicon nitride layer, the etched semiconductive semiconductor layer limiting to the buried oxide layer, to the semiconductor oxide layer or to the electrically insulating layer, whereby the trench extends to said silicon nitride layer, by using plasma etching,
applying to the trench hydrogen fluoride (HF) based etching liquid, such as HF:ethanol, HF:water, HF:water:ethanol, HW:isopropanol, HF:water:isopropanol, and/or with other additives, in a suitable concentration, in particular 1:1, 1:2, 1:4 or any other concentration, at least partly simultaneously to applying an electrical field over the semiconductor wafer so that porous semiconductor channels opening to the trench are formed; and
removing the hydrogen fluoride based etching liquid. All three methods are suitable for preparing such a trench in the semiconductor layer that comprises porous channels opening to the trench, while not destroying the buried oxide layer or the semiconductor oxide layer that is immediately below the semiconductor layer.

In this manner, the buried oxide layer, the semiconductor oxide layer, or the electrically insulating layer (which in particular may be a silicon nitride layer), such as readily available in commercially available silicon-on-insulator wafers, can be utilized as a reinforcement for the blank or for the resulting supercapacitor. Furthermore, should the wafer contain a further silicon layer on the other side of the buried oxide layer, the semiconductor oxide layer, or the electrically insulating layer the layer can then be used conveniently not only for contacting the electrodes of the supercapacitor but optionally also for integrating further microelectronic components on the same component.

Preferably, in the first, second and/or third method of selectively forming porous semiconductor channels opening to a trench, the trench is etched to divide a layer of the semiconductor wafer to a first porous semiconductor volume and a second porous semiconductor volume in such a manner that:

the second porous semiconductor volume is laterally surrounded by the first porous semiconductor volume; and
the second porous semiconductor volume is separated from the first porous semiconductor volume by the trench that is suitable for receiving an electrolyte, and wherein the first and second porous semiconductor volume comprise channels opening to the trench.

In this manner, the method for preparing the trench in the semiconductor layer that comprises porous channels opening to the trench, while not destroying the buried oxide layer, the semiconductor oxide layer or the electrically insulating layer that is immediately below the semiconductor layer, can be improved also to vertically from below constrain the electrolyte that will be added later into the trench, if the component is going to be used as a supercapacitor. In this manner, not only the sealing of the ends of the trench can be avoided. As the sealing for the electrolyte will be necessary only for the top of the trench, the skilled person appreciates this to improve the sealing accuracy in the manufacturing of the supercapacitor, or save effort during the manufacturing.

Preferably in the first, second and/or third method of selectively forming porous semiconductor channels opening to a trench, the trench is at least partly coated by an electrically conductive material, compound or alloy by using atomic layer deposition, for example and particularly advantageously by TiN. Instead of TiN, NbN and/or electrically conducting oxides or metal might be used. If made to a supercapacitor, the stability of the resulting supercapacitor can be increased while obtaining a sufficiently large capacitance.

If the trench is at least partly coated, then preferably the electrically conductive material, metal, compound, oxide or alloy is (at least partly if not fully) removed from the bottom of the trench. This is particularly useful if the resulting product is going to be used as a supercapacitor since in this manner, unintentional short-circuiting of the electrodes can be better avoided. Even though completely removing the material, metal, compound, oxide or alloy may be difficult, it may be enough to remove it substantially so that there will be no short-circuit over the trench through the remainings.

Advantageously, all three methods are used to prepare the blank suitable for use as a body of a supercapacitor according to the first aspect of the invention, or the supercapacitor according to the first aspect of the invention.

The semiconductor may be silicon or comprise silicon. Alternatively to this or in addition, the semiconductor wafer may be a single or double-sided polished silicon-on-insulator wafer or a single or double-side polished silicon wafer joined to a silicon nitride layer.

The method of using porous silicon (PS)-TiN hybrid material fabricated by electrochemical etching of bulk silicon into nanoporous silicon and subsequent highly conformal atomic layer deposition coating of TiN in a silicon nanostructure is a useful method in miniaturizing supercapacitors.

The method of manufacturing a porous silicon volume comprises the steps of:
setting an electric field over a silicon structure that comprises a semiconductive silicon layer; and
introducing hydrogen fluoride based etching fluid, in particular mixture of hydrogen fluoride and ethanol, to the semiconductive silicon layer to form porous silicon volume in the semiconductive silicon layer selectively so that the direction of the channels that are formed by the etching fluid is directed by the electric field lines.

In the self-limiting etching method for manufacturing a porous silicon volume comprises, in addition to the selective formation method, the silicon structure further comprises an electrically non-conductive layer such as a BOX layer, a $SiO_2$ layer or an electrically insulating layer that in particular may be a silicon nitride layer, limiting to the semiconductive silicon layer. The porous silicon is formed in the semiconductive silicon layer in a self-limiting manner such that the porous silicon limits to the electrically insulating layer.

The method of shaping a porous silicon structure comprises the step of removing some of the porous silicon in a silicon structure that has been obtained by introducing etching liquid into the silicon structure through an entrance location, wherein the removing of the porous silicon is carried out by plasma etching at the entrance location. In this manner, the permeability of the porous silicon structure for liquid electrolyte can be increased, since normally, after etching liquid, the channels are thinner at the entrance location and get wider deeper. So when the porous silicon around the entrance location is at least partly removed by plasma etching, the wider part of the channels function as openings for the electrolyte channels.

In the method of manufacturing electrodes in a silicon structure a trench is coated with a conducting layer, in particular by TiN and/or NbN and/or at least one electrically conducting oxide or metal, and the coating so applied is then removed from the bottom of the trench by plasma etching.

BRIEF DESCRIPTION OF THE DRAWINGS

In the following, the invention is described in more detail with reference to the attached drawings, of which.

Same reference numerals refer to same technical elements in all FIG.

DETAILED DESCRIPTION

I. Introduction: The Sandwiched Supercapacitor

We have demonstrated that PS-TiN hybrid material fabricated by electrochemical etching of bulk Si into mesoporous Si and subsequent highly conformal atomic layer deposition coating of TiN (FIGS. 1, 2, 9, 10 and 11) provides an attractive solution to the show-stopper problems preventing broad utilization of silicon nanostructures and porous Si in micro-supercapacitors.

Figure 1:
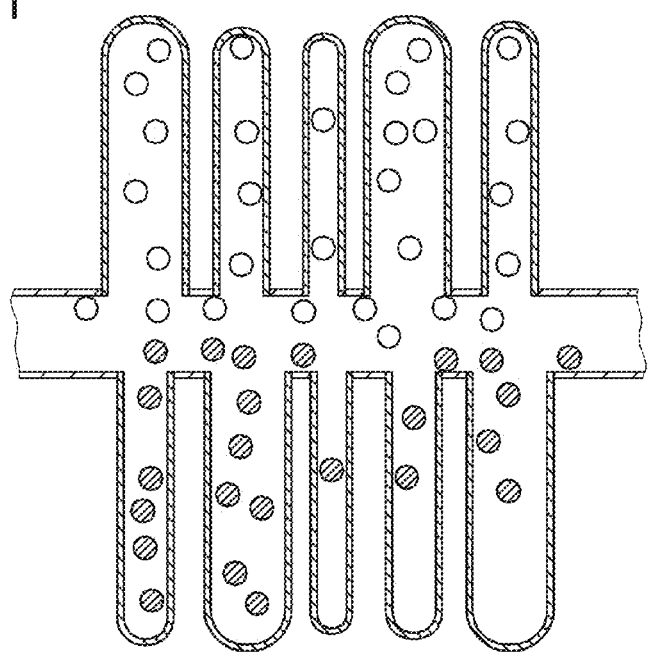
FIG. 1 illustrates schematically the structure of a porous silicon-TiN-electrolyte-TiN-PS supercapacitor with NaCl electrolyte.

In FIG. 1, the channels in porous silicon have been depicted in a simplified manner as vertical channels and separated by a horizontal trench. An electrolyte such as NaCl dissolved in water has been introduced into the trench so that it can also enter the channels. In FIG. 1, white circles denote $Na^+$ ions and closed circles denote $Cl^-$ ions.

Figure 2:
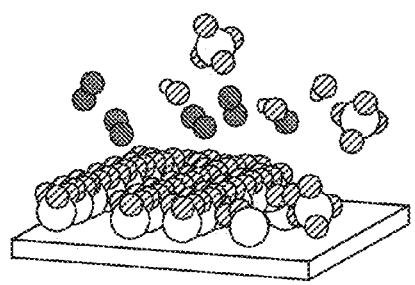
FIG. 2 is a schematic 3D picture of first part of one ALD cycle of TiN layer growth in initial phase.
Figure 3:
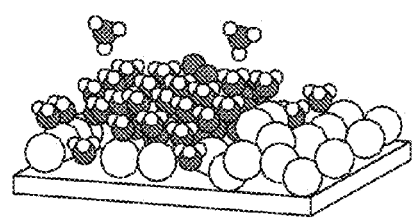
FIG. 3 is a schematic 3D picture of second part of one ALD cycle of TiN layer growth in an intermediate phase.
Figure 4:
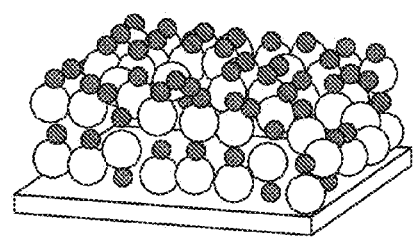
FIG. 4 is a schematic 3D picture of a TiN layer after a few ALD cycles.

FIG. 2 illustrates a $TiCl_4$ pulse of an ALD cycle for formation of TiN. FIG. 3 illustrates an $NH_3$ pulse of an ALD cycle for formation of TiN. FIG. 4 illustrates a TiN layer after a few cycles schematically illustrated in FIGS. 2 and 3.

Figure 11:
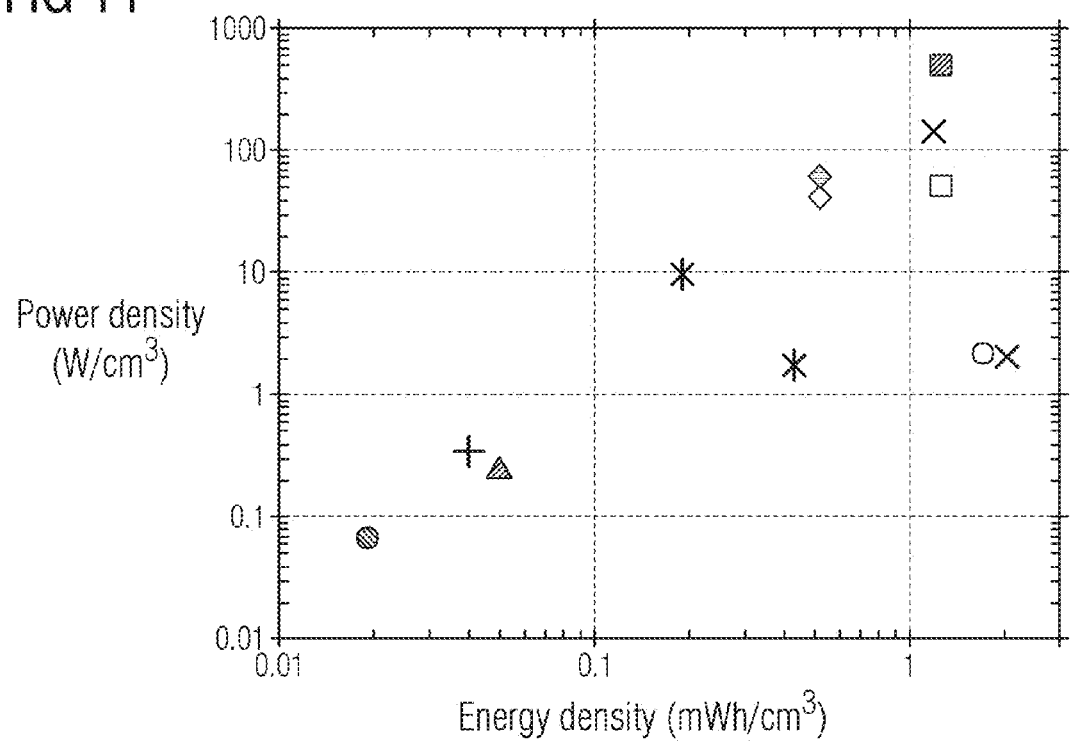
FIG. 11 is a Ragone plot for our samples compared with data reproduced from other works.

Comparison of energy density and power density between different approaches potential for on-chip applications reported in the literature together with our PS-TiN hybrids are summarized in the Ragone plot of FIG. 11 and Table 1.

TABLE 1

Characteristics of devices with aqueous and organic electrolyte. Capacitance values measured by galvanostatic charge/discharge for devices with two symmetrical silicon electrodes and specific volumetric values taking PS area and thickness into account. The measurements reported below are performed using the superconductor structure depicted in FIG. 8.

| Parameter | Aqueous (#A) | Organic (#O) |
| --- | --- | --- |
| Measured capacitance, mF | 4.7 | 2.6 |
| Specific volumetric capacitance, $F/cm^3$ | 2.6 | 1.4 |
| Power density, $W/cm^3$ | 59 | 500 |
| Energy density, $mWh/cm^3$ | 0.5 | 1.3 |

The PS-TiN hybrid supercapacitor structures investigated here are depicted in FIGS. 1, 2, 3, 4, 9, 10, 11 and 12. Porous silicon (FIG. 9) with pore size in the range between 10 nm and 100 nm was coated with about 10-20 nm thick TiN layer using atomic layer deposition (ALD), as depicted schematically in FIG. 2 to 4.

ALD provides conformal coating even for structures with very high aspect ratio, and in supercapacitors TiN provides the required good electrical conductivity and chemical stability towards common electrolytes.

The TiN ALD process used here showed extremely high conformality being capable to coat over 1/1000 aspect ratio structures. The resistivity of our TiN layers was 0.16 mΩ-cm while the first prototypes had resistivity around 0.6 mΩ-cm, which is comparable to other data.

Figure 9:
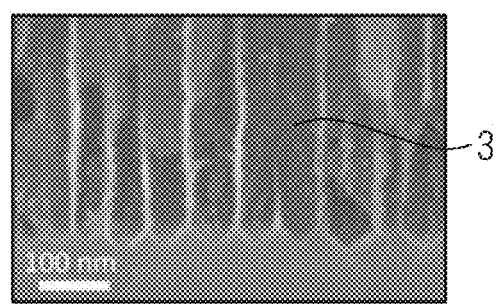
FIG. 9 is a larger magnification SEM image of bottom part of porous silicon layer of FIG. 7 before (pristine) ALD conformal coating with 20 nm thick TiN layer.
Figure 10:
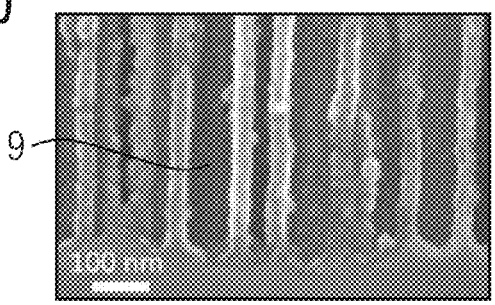
FIG. 10 is a larger magnification SEM image of bottom part of porous silicon layer of FIG. 7 after ALD conformal coating with 20 nm thick TiN layer.

Good electrical conductivity of TiN is of key importance here as Si exhibits relatively high resistivity (even if heavily doped, remember that silicon is conductive but less conductive than TiN coating) and in high surface area silicon nanostructures the resistance is further increased due to traps, quantum confinement and depletion effects. Scanning electron microscope (SEM) images of PS structures before and after the TiN coating are shown in FIGS. 9 and 10, respectively, confirming the conformality of the TiN coating. In addition, the coating converts PS to highly hydrophilic, improving the filling of the pores with aqueous electrolytes in comparison to pristine porous Si.

The fabrication of the TiN coated PS electrodes, including lithography, PS formation and ALD, was carried out on 150 mm Si wafers (FIG. 7) exploiting standard tools and processes typical to microelectronics industry. To test and compare the feasibility of the uncoated PS electrodes and PS-TiN hybrid electrodes both NaCl based aqueous and organic TEABF4/PC electrolytes were used in the experiments.

Parameters of devices #A (aqueous electrolyte) and #O (organic electrolyte) are gathered in Table 1.

The triangular, almost symmetric shape of the curves is a signature of good performance as EDLC. The efficiency of the supercapacitors as evaluated from the charge-discharge curves is high, 88% and 83% for the aqueous and the organic electrolyte, respectively. Galvanostatic charge-discharge characterization of devices with as prepared porous silicon electrodes without the TiN coating reveal poor performance as EDL capacitor, consistent with previous literature on Si devices.

Small signal frequency response of the PS-TiN supercapacitors can be verified with a Nyquist plot, where the imaginary component Z" of the impedance is plotted against the real component Z'. In our measurements almost purely capacitive behaviour of our devices was indicated by the small real component and high knee frequencies, where the angle of polar curve approaches 45°. The knee frequencies were 400 Hz for sample #O and 200 Hz for sample #A. The semicircle in the high frequency part indicated extremely small resistance for charge transfer between electrolyte and porous electrode, i.e., the Warburg impedance describing diffusion of ions to porous electrode is small. Equivalent series resistance (ESR) values evaluated from the Nyquist plot by extrapolating the straight vertical part of the polar curve to intersect the Z'-axis are 5Ω and 18Ω for samples #A and #0, respectively. This is in good agreement with ESR values obtained from the pulse series measurements of FIG. 15: 5Ω and 17Ω for #A and #0, respectively.

Figure 19:
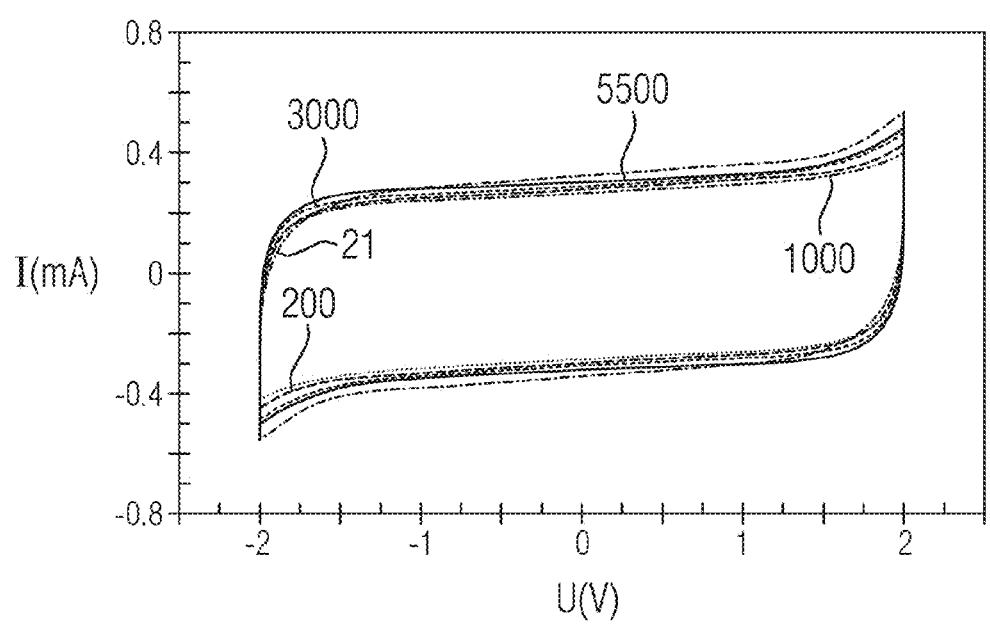
FIG. 19 illustrates cyclic voltammetry characteristics of sample M50 (sample #O with organic electrolyte) curves during 21, 200, 1.000, 3.000 and 5.000 cycles performed at 100 mV/s scan rate within −2.0; +2.0 V window.
Figure 20:
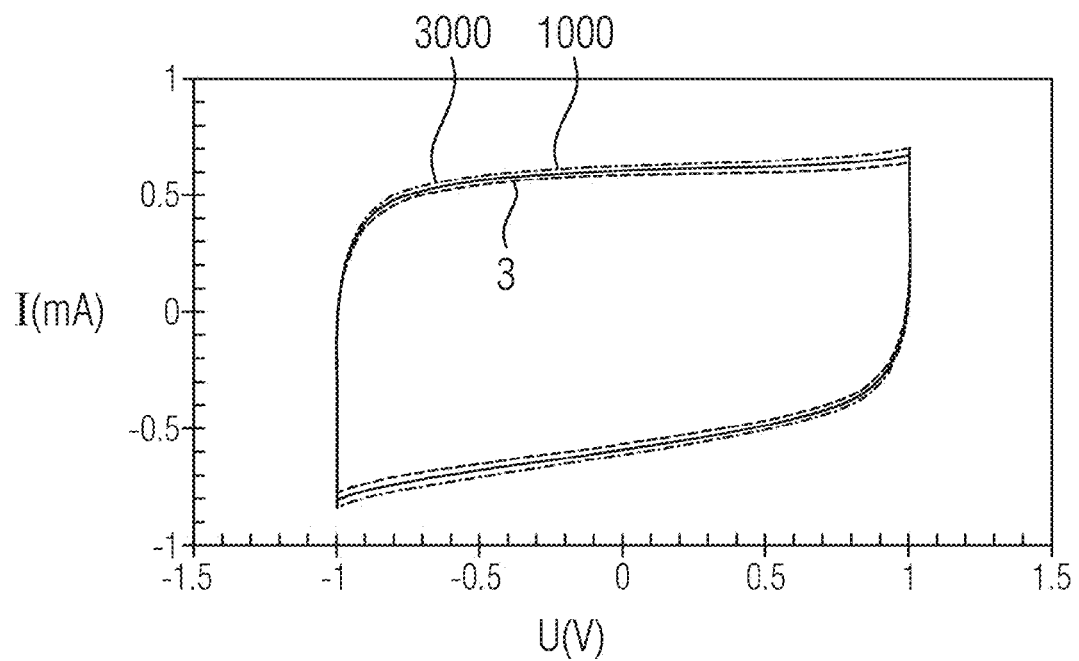
FIG. 20 illustrates cyclic voltammetry characteristics of sample M47 (sample #A with aqueous electrolyte during 3, 1.000, and 2.000 cycles obtained at 100 mV/s within −1.0 V-1.0 V window.

Performance of the PS-TiN hybrid electrodes was further investigated by extensive cyclic voltammetry (CV) measurements (FIGS. 20 and 19). The curves obtained for both aqueous and organic electrolytes at different scan rates are of almost ideal rectangular shape, and normalised CV curves show low variation of capacitance (FIGS. 20 and 19), confirming almost pure EDLC behaviour. Such behaviour is unparalleled in Si-based nanostructures and, indeed, our uncoated samples show again highly non-ideal behaviour. In FIG. 20 are shown CV curves measured from the device with aqueous electrolyte (device #A). The device shows good stability during the 3, 1000 and 3000 charge-discharge cycles performed within −1.0 V-+1.0 V voltage window, which is close to the maximum voltage window for aqueous electrolyte. Longer cycling measurements were performed within voltage window 0.5 V-1.0 V.

Our measurements show capacitance retention up to 13,000 cycles (limited by the available measurement time). The initial transient/drop in capacitance could be associated with partial oxidation of TiN top layer and/or blocking of the smallest pores by the decomposition products from the electrolyte or heating.

The CV curves contain no oxidation and reduction related current peaks, confirming the stability of TiN coating in aqueous electrolyte. Devices with organic electrolyte can be operated at larger voltage, resulting in higher maximum power. Cyclic voltammetry scans up to 2.5 V show that above 2.0 V the charging current begins to increase, which can be linked to presence of moisture in the organic electrolyte. The capacitance retention was measured within −2.0 V-+2.0 V window. The CV curves exhibit almost perfect rectangular shape. Fast drop in capacitance is observed during the first 300 cycles, similar to results for aqueous electrolyte, after which the capacitance slowly approaches the initial value. Longer CV testing within 1.0 V and 2.0 V voltage window (13,000 cycles) also shows good capacitance retention, similar as for sample with aqueous electrolyte.

The specific capacitance values of our PS-TiN hybrid devices confirm successful action of ALD coating (Table 1). Volumetric energy and power—the figure of merit parameters for micro-capacitors—of our PS-TiN hybrid devices compare favourably to those of other approaches (Table 1 and FIG. 11). These both quantities are by at least two orders of magnitude larger than the corresponding values for doped and coated silicon nanowires or titanium nitride nanowires or for photoresist derived carbon. Our sample #O gives a power density value of 500 W/cm$^3$, which is at least 150 times larger than the power densities reached with supercapacitors based on silicon nanostructures reported in the previous literature. Only the recent graphene supercapacitors exhibit similar power densities.

In FIG. 11,
shadowed circle denotes SiC;
shadowed triangle denotes TiN nanowires;
shadowed diamond denotes A/0.1 mm PDMS;
shadowed square denotes O/0.1 mm PDMS;
plus denotes SU-8 carbon;
stars denote RGO;
crosses denote Laser written GO;
open diamond denotes A/2.0 mm PDMS; and
open square denotes O/2.0 mm PDMS.

PS-TiN hybrid electrodes facilitate on-chip integration of scalable small foot print supercapacitors for local energy storage. One attractive route for integration is to utilize partially the volume of the bulk of a silicon chip, which otherwise merely serves as a non-functional platform for integrated micro and nano devices.

If we, e.g., take a standard Si chip and use 50% of its volume for the supercapacitor from Table 1 values we get capacitance of 1 mF (0.6 mF), energy of 0.6 mJ (1.5 mJ) and power of 20 mW (169 mW) per 1 mm$^2$ area on chip with aqueous (organic) electrolytes. These values are very attractive for on-chip integration and at least three orders of magnitude larger than those that can be obtained by the conventional methods based on solid-solid capacitors. Further improvement can be reached by optimizing porosity, ALD coating and electrolyte.

In summary, we have combined electrochemical etching of Si and atomic layer deposition of TiN and developed nanoporous Si-TiN hybrid electrodes, which can be used for high performance micro-supercapacitors. These hybrid electrodes exhibit efficient and stable operation and reach the performance levels of carbon based materials, whereas pristine silicon nanostructures cannot be directly used as a supercapacitor electrode due to chemical instability and high resistivity. Important factors for porous silicon use in micro-supercapacitors are the compatibility with a standard silicon microfabrication processes and the ability to utilize the non-functional volume of silicon chip for the supercapacitor—both factors facilitating on-chip integration.

II. Methods a) Preparation of Porous Silicon.

The description here describes the manufacturing method of samples that we used as our test structures, aiming to optimise the structure of porous silicon/TiN electrodes.

Heavily doped 150 mm diameter (100) oriented p-type silicon wafers of 1-4 mΩ cm resistivity (doping $2.75 \times 10^{19}$-$1.3 \times 10^{20}$ cm$^3$) were used as initial material. Also (110) and (111) wafers can be used, likewise any other resistivity ranges can be selected.

Figure 7:
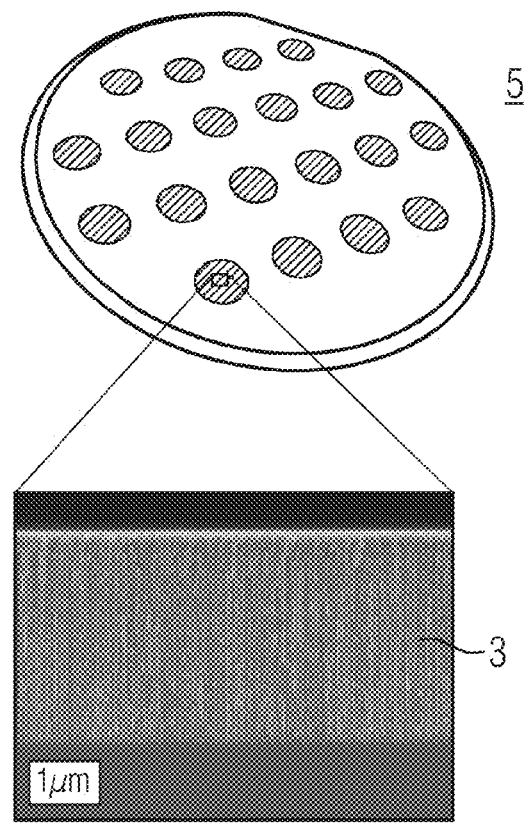
FIG. 7 is a view of 150 mm diameter silicon wafer with circular porous silicon areas etched through patterned silicon nitride mask layer; the detail is a scanning electron microscope of a section of the same.

200 nm thick silicon nitride layer was deposited by low pressure chemical vapour deposition (LPCVD) technique to form a mask for porous silicon formation. Silicon nitride mask was patterned by UV lithography and plasma etching, resulting in 20 identical circle-shaped windows of 1.4 cm diameter each (FIG. 7). Porous silicon windows were prepared by electrochemical etching of a whole silicon wafer in commercial etching cell (AMMT, Germany) containing 50% HF and ethanol solution 1:4. The porosity of the PS layer, as evaluated from gravimetric measurements, was 87-88%. The mass of single porous electrode layer (6 μm thick, 1.5 cm$^2$ area) was evaluated to be 0.27 mg.

b) Atomic Layer Deposition.

TiN layer was grown inside the pores by thermal ALD process in a Beneq® (registered trademark of Beneq Oy in Finland and in the European Community) TFS-500 reactor or Picosun® (registered trademark of Picosun Oy in Finland and in the European Community) SUNALE R-200. TiCl$_4$ and ammonia were used as precursor gases. The process was conducted at 723 K temperature keeping 800 Pa pressure inside the reaction chamber. Nitrogen was used as a carrier gas for precursor transportation and also for the purging of the reaction chamber after each precursor pulse. The precursor pulse/purge duration was 0.5 s/10 s and 2 s/40 s for TiCl$_4$ and ammonia, respectively. Process sequence is depicted in FIG. 1b. Amount of TiN layer deposited inside the pores was 0.9 mg, as estimated from gravimetrical measurements.

Assembly and filling with electrolyte. Processed wafers were cleaved into 23×23 mm$^2$ chips with a single porous area at the centre.

Two silicon chips with porous silicon area in the middle were sandwiched with a frame of polydimethylsiloxane (PDMS) between them. The PDMS frame, about 2 mm thick, was prepared from Sylgard 184 and it served as a reservoir for the electrolytes.

Silicon chips and PDMS were joined together by bonding. The cell was filled with electrolyte using a syringe. We used 1 M NaCl water solution (aqueous electrolyte) and 0.5 M TEABF4 in PC (tetraethyl ammonium tetrafluoroborate in propylene carbonate, organic electrolyte).

Inspection and measurement techniques. As prepared and TiN coated porous silicon layers were observed with a LEO® (a registered trade mark of Carl Zeiss NTS GmbH or Carl Zeiss Microscopy GmbH in several countries) Supra-35 (Supra® is a trade mark of Carl Zeiss NTS GmbH registered at least in the United States and in Czech Republic) scanning electron microscope. The resolution was sufficient to evaluate the silicon pore size, as well as the conformality and thickness of a subsequent ALD coating inside the pores. The porosity of the PS layer was calculated from the gravimetric measurements using Sartorius® CP224S laboratory balances with resolution of 0.1 mg (Sartorius® is a registered trade mark of Sartorius AG in various countries).

All electrical characterization was performed to the symmetric structures described above. Galvanostatic charge-discharge curves at 0.1 mA and 1.0 mA were measured with Arbin supercapacitor test station (Arbin Instruments, USA). Arbin test station also gives pulse measurement ESR. In the cyclic voltammetry (CV) scans and electrochemical impedance spectroscopy we utilized IviumTech potentiostat (Ivium Technologies, the Netherlands).

In other words, the theoretical background of fabrication of electrodes using porous silicon etching and ALD TiN is relatively well established and tested with capacitor structures consisting of two separate electrodes attached to each other with a PDSM ring.

Figure 8:
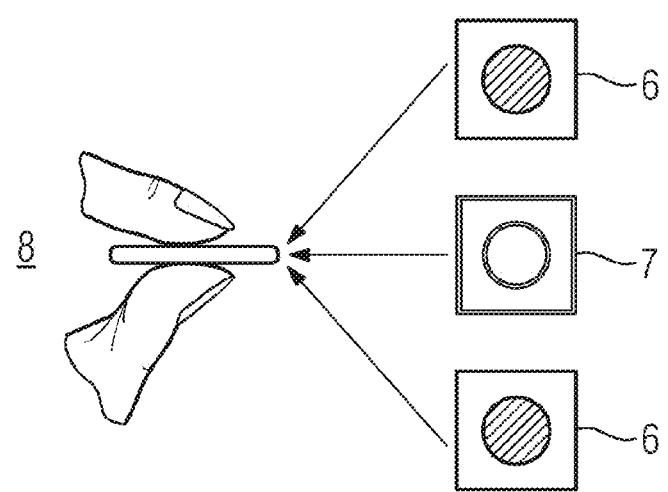
FIG. 8 illustrates our samples made from the SOI wafer of FIG. 7.

Our results are reproducible and show that using the method developed by us, the sandwiched micro supercapacitor, the structure of which is schematically shown in FIG. 8, are superior in capacitance, energy and power density to any micro supercapacitor known to us so far.

III. Supercapacitor Inside a Silicon Wafer, and Blank for the Same

In the following, we describe a supercapacitor inside a silicon wafer, and a blank for the same. Examples of the structure of the supercapacitor and the blank are shown in FIG. 21 to 39.

Our proof-of-concept demonstrators were fabricated inside the handle of a SOI wafer and inside a bulk silicon wafer. The devices show the expected behaviour, e.g., about 120 µF capacitance for a structure with a trench that is a ring having 1 cm diameter. The structure of the devices can be optimised further, in particular as regards their geometry and robustness.

Proof-of-Concept device has been fabricated and characterised. Its operation was as expected.

The micro supercapacitor can be exploited as integrated energy storage in energy harvesters, smart systems, or autonomous devices. Fields of their use include energy harvesting, on-chip energy storage, smart systems, autonomous systems, and integration with batteries.

The advantages of the micro supercapacitor may include: small size, high performance, can be integrated directly on or inside the chip, can use the otherwise unused volume of handle wafers, enhancing the efficiency, scalable, fabrication using microelectronics processes and materials, suitable for heterogeneous integration. High energy and power density, capacitance may be scalable, can be integrated either directly on or in-chip or by using packaging techniques.

IV. Selective Formation of Porous Silicon and Self-Limiting Etching

Figure 5:
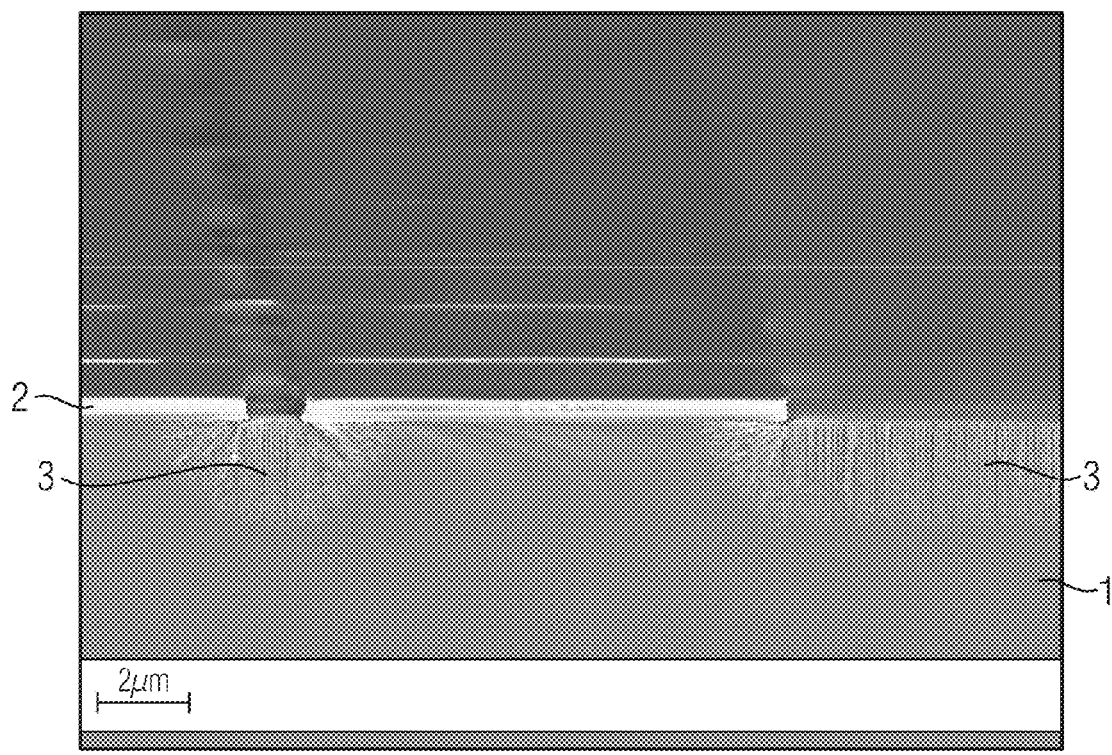
FIG. 5 is a scanning electron microscope image illustrating the manufacturing of porous silicon by selective formation of porous silicon.

FIG. 5 is a scanning electron microscope image illustrating selective formation of porous silicon 3 volume. Semiconductive silicon layer 1 (in the following, the term "silicon" may be used for semiconductive silicon layer) is masked with $Si_3N_4$ mask 2. The porous silicon 3 volume is formed by etching in silicon.

An electric field is set over the structure comprising semiconductive silicon layer 1 and mask 2. Then hydrogen fluoride based etching fluid (such as in particular mixture of hydrogen fluoride and ethanol) is introduced into silicon layer 1. The etching fluid creates a porous structure (i.e. porous volume 3) in the silicon layer 1, whereby the channels formed by the etching fluid tend to follow the electric field lines i.e. they are directed by the electric field lines.

We have further improved the method of selective formation of porous silicon 3 volume to a method that we call self-limiting etching.

Figure 6:
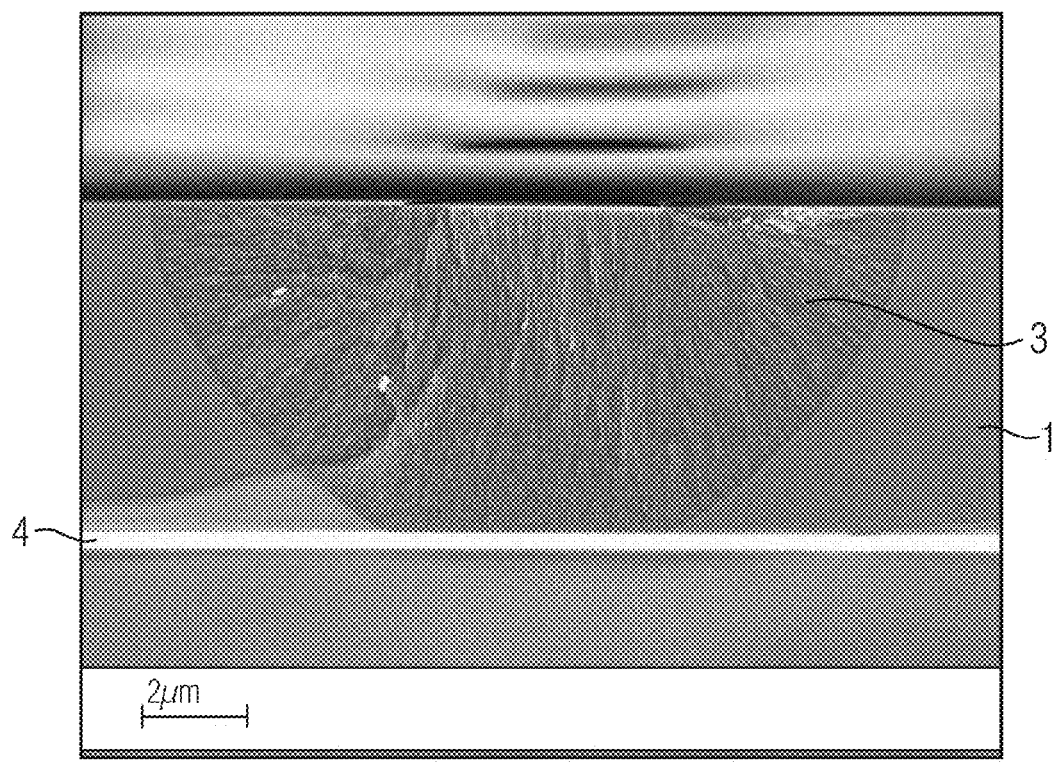
FIG. 6 illustrates the manufacturing of porous silicon by self-limiting etching.
Figure 6:
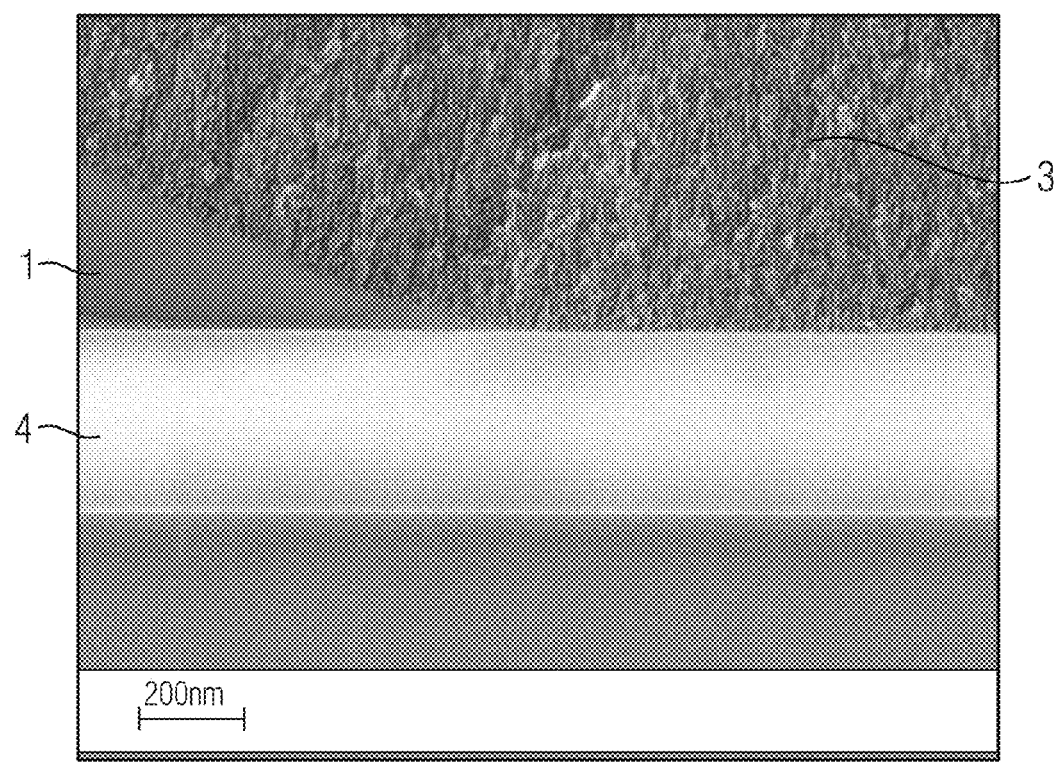

FIG. 6 illustrates the manufacture of porous silicon 3 volume by self-limiting etching (the image on the left is a SEM image and the image on the right is a magnification showing details of the etched channels porosity forming). The silicon structure comprises in addition to the semiconducting silicon layer 1 also an electrically insulating layer 4 (which may be a BOX layer and/or a $SiO_2$ layer and/or a SiN layer) limiting to the semiconductive silicon layer 1.

The porous silicon 3 volume is formed in the semiconductive silicon layer 1 in a self-limiting manner such that the porous silicon 3 limits to the electrically insulating layer 4.

FIG. 7 illustrates SOI wafer 5 after porous silicon etching in SOI wafer 5. We cleaved chips 6 from the SOI wafer 5 and used them to prepare samples 8 (cf. FIG. 8) so that between two chips was a PDMS layer. Under SOI wafer 5 is a SEM image of the SOI wafer 5 showing the structure of porous silicon 3. AS can be seen, porous silicon 3 was formed by selective formation method.

FIG. 9 shows porous silicon 3 in larger magnification.

We also coated porous silicon 3 by atomic layer deposition. FIG. 10 shows coated porous silicon 9. As coating we used TiN.

FIG. 11 is a Ragone plot for various materials.

Figure 12:
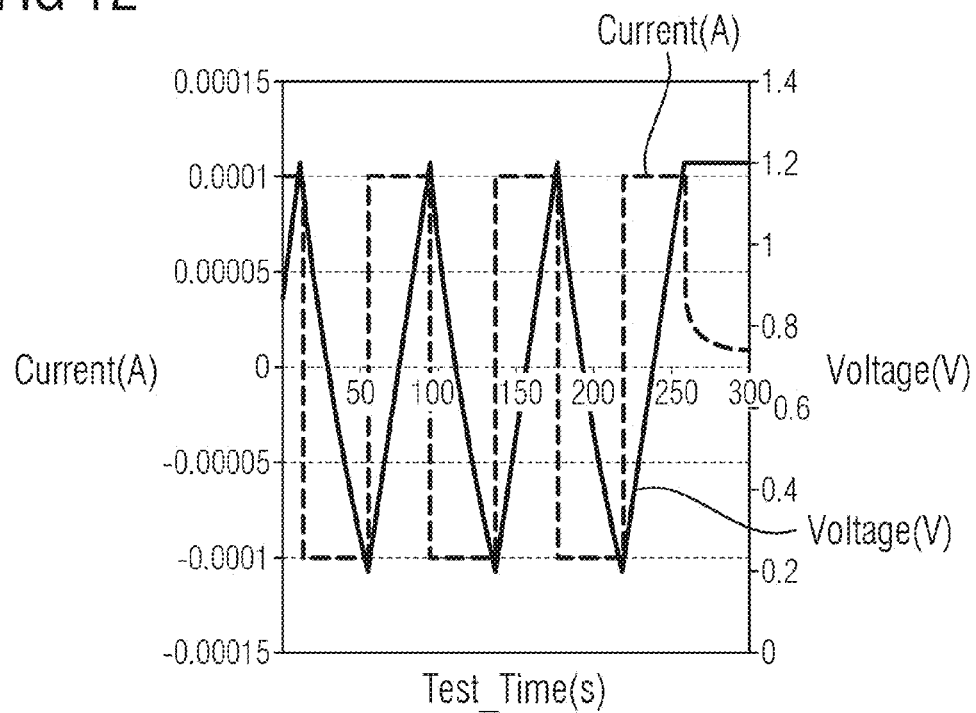
FIG. 12 illustrates measurements for sample M47 (NaCl) consisting of two porous silicon electrodes separated by a PDMS collar (FIG. 8)
Figure 13:
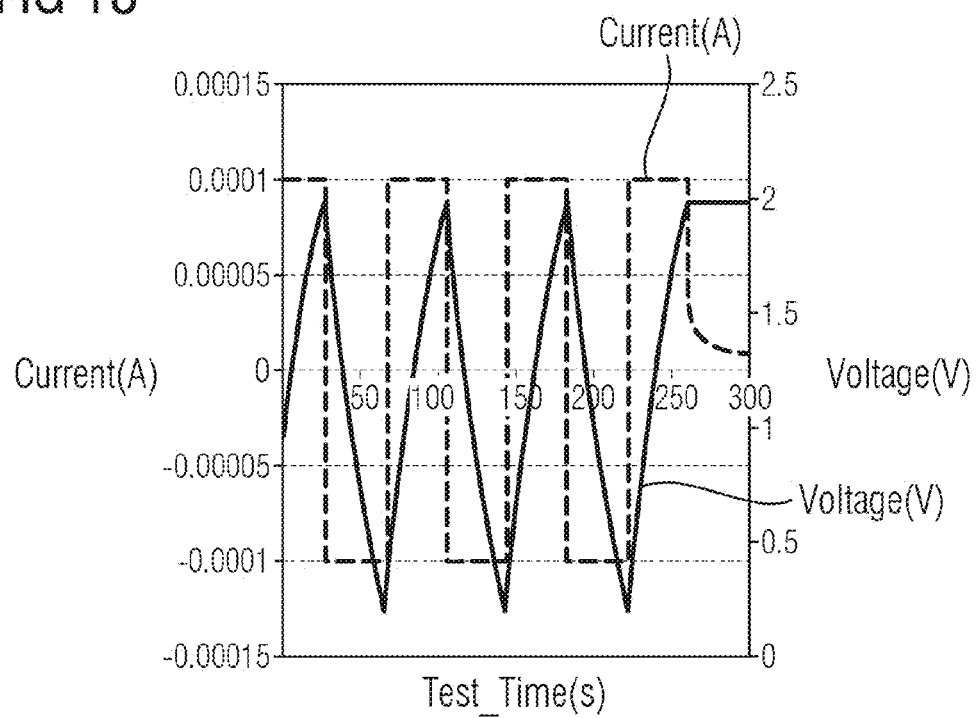
FIG. 13 illustrates measurements for sample M50 (TEABF4/PC)
Figure 14:
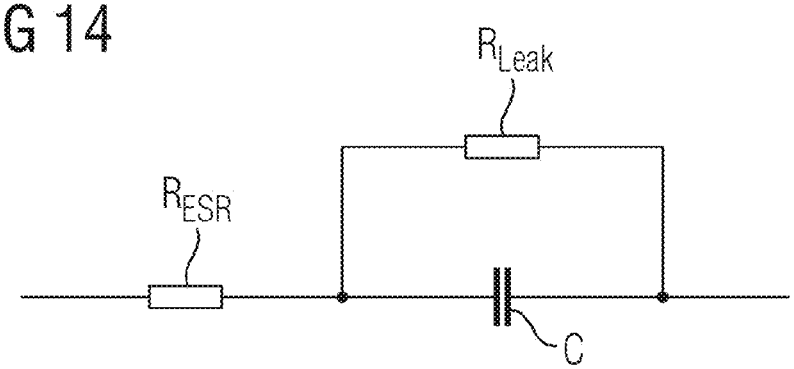
FIG. 14 illustrates a simplified equivalent circuit for the samples.

FIGS. 12 and 14 illustrate two-electrode measurements for samples 8 sample M47 (FIG. 12, NaCl) and for sample M50 (FIG. 13, TEABF4/PC). The same measurement principle was used in measurements shown in FIG. 10 to 20.

FIG. 14 illustrates a simplified equivalent circuit for the samples. In addition to capacitance C, the sample 8 has as its equivalent series resistance $R_{ESR}$ and a leak resistance $R_{Leak}$.

Figure 15:
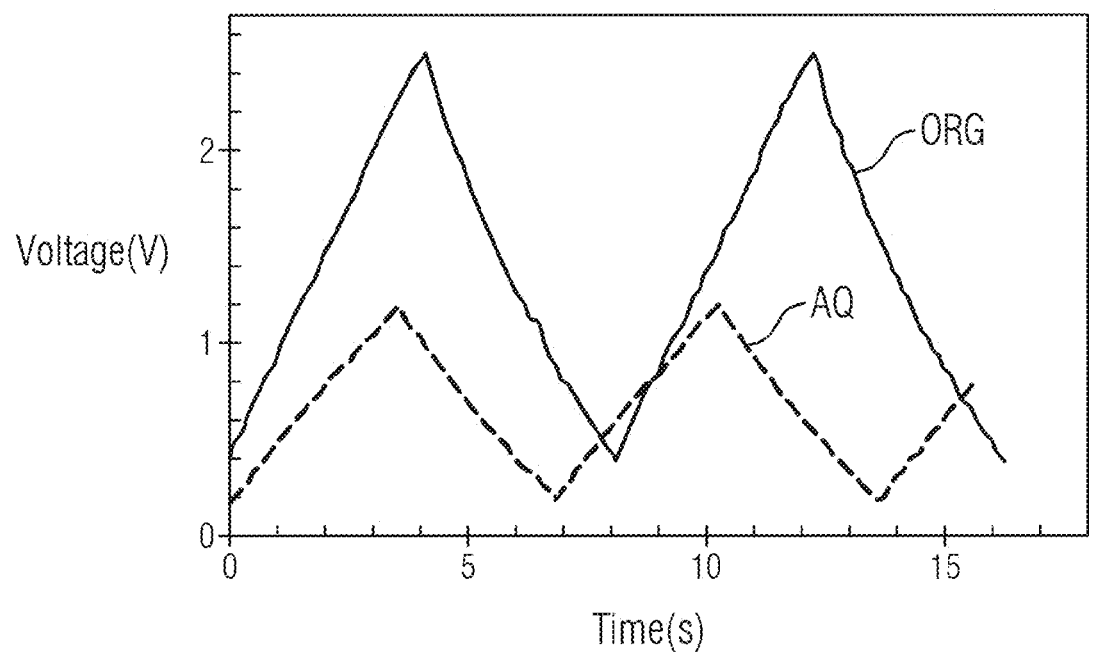
FIG. 15 illustrates electrochemical characteristics (galvanostatic charge/discharge curves) of cells with aqueous (# A) and organic (# O) electrolytes at 1.0 mA.

FIG. 15 shows galvanostatic charge-discharge curves for samples M47 (A) and M50 (O).

Figure 16:
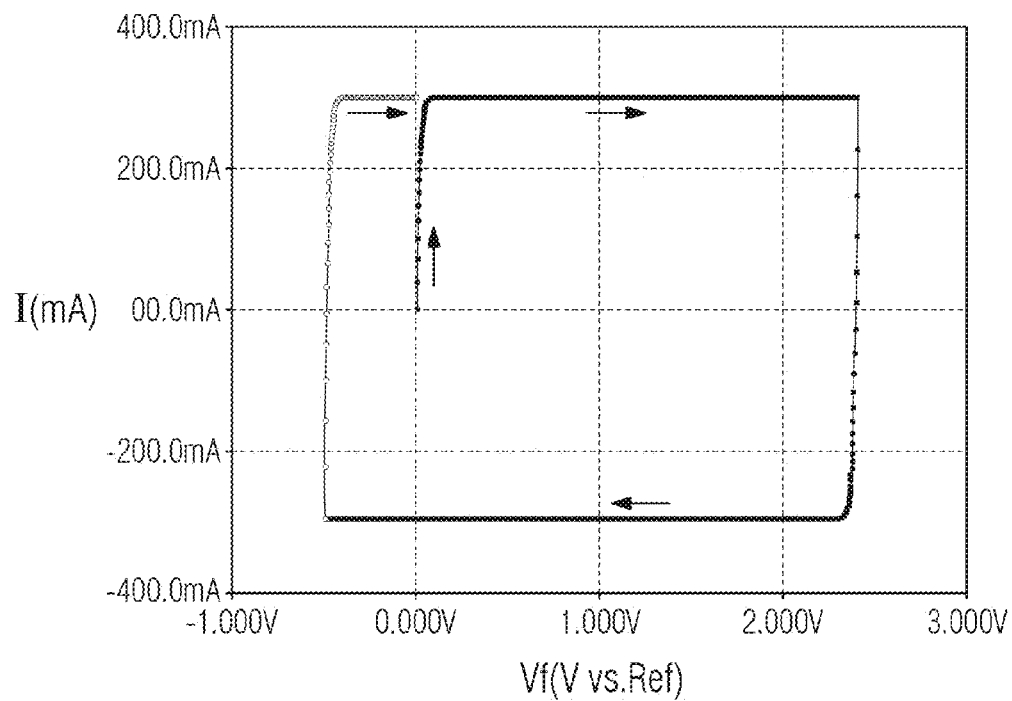
FIG. 16 shows a theoretical cyclic voltammetry curve for a 3 F EDLC in series with a 50 mΩ ESR.
Figure 17:
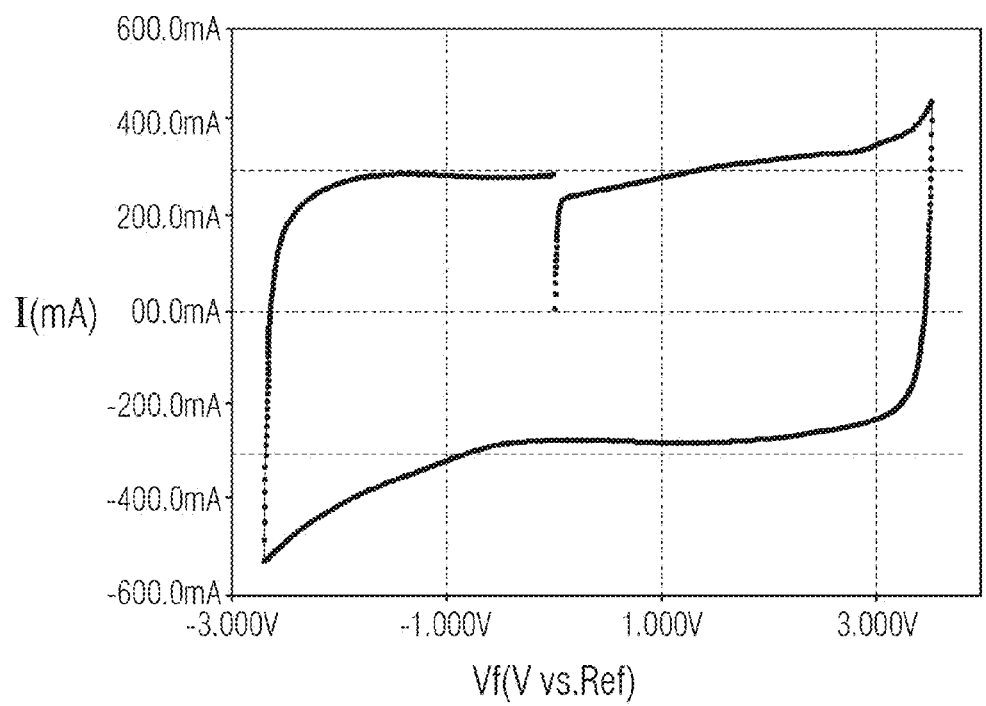
FIG. 17 shows a measured cyclic voltammetry curve for a 3 F EDLC in series with a 50 mΩ ESR.

FIG. 16 shows a theoretical cyclic voltammetry curve for a 3 F EDLC in series with a 50 mΩ ESR. FIG. 17 shows a real (measured) cyclic voltammetry curve for a 3 F EDLC in series with a 50 mΩ ESR.

Figure 18:
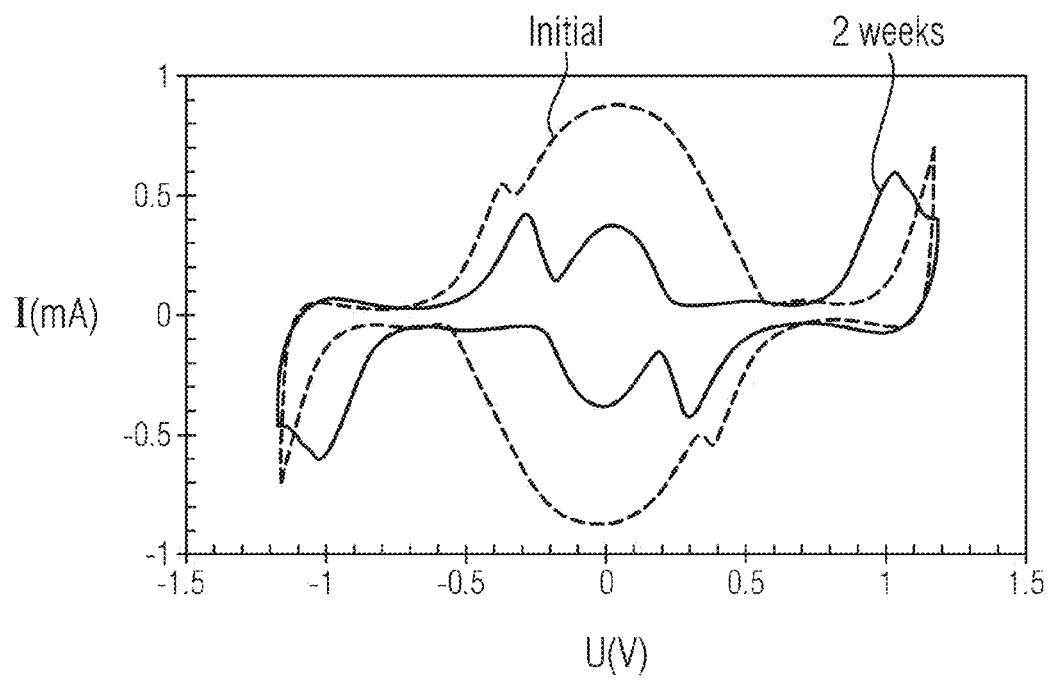
FIG. 18 shows a measured cyclic voltammetry curve for porous silicon electrodes without coating.

FIG. 18 shows a measured cyclic voltammetry curve for a sample 8 with porous silicon electrodes without coating (i.e. formed of porous silicon 3) initially and after two weeks. As can be seen, porous silicon electrodes 3 may not so regarded as very stable and they may therefore be only limitedly suitable for long-term applications.

V. Trench Preparation

Figure 21:
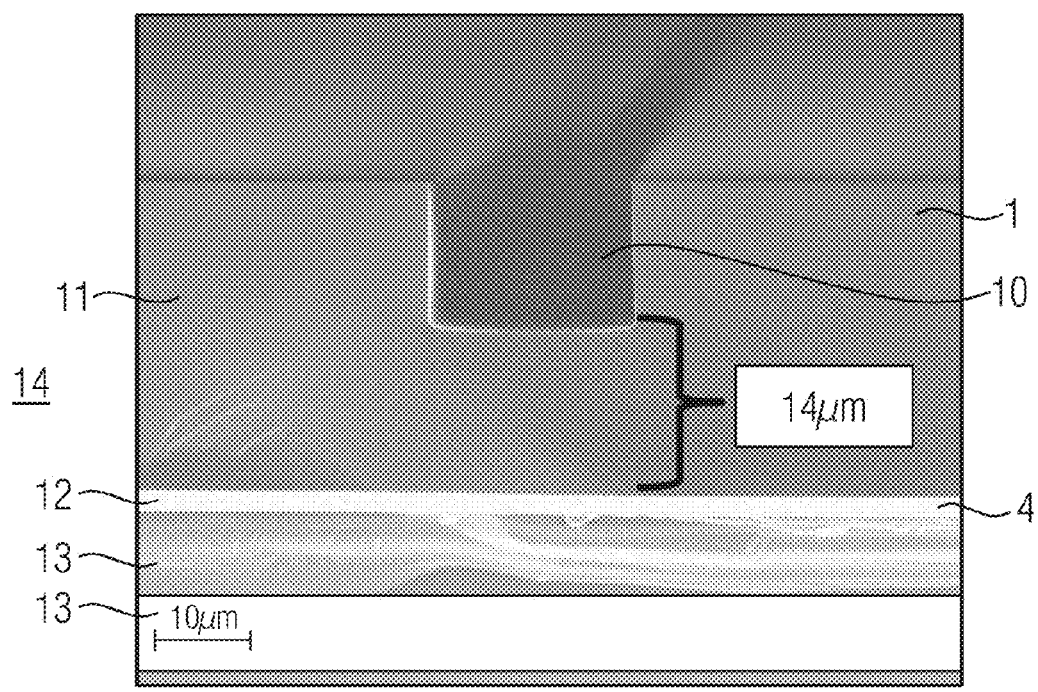
FIG. 21 is a SEM image illustrating a trench in SOI layer that has been manufactured by plasma etching in n+Si wafer.

FIG. 21 is a SEM image in which trench 10 in SOI layer 11 that has been manufactured by plasma etching is in n+Si wafer 14. Shown are also BOX layer 12 and handle layer 13.

Figure 22:
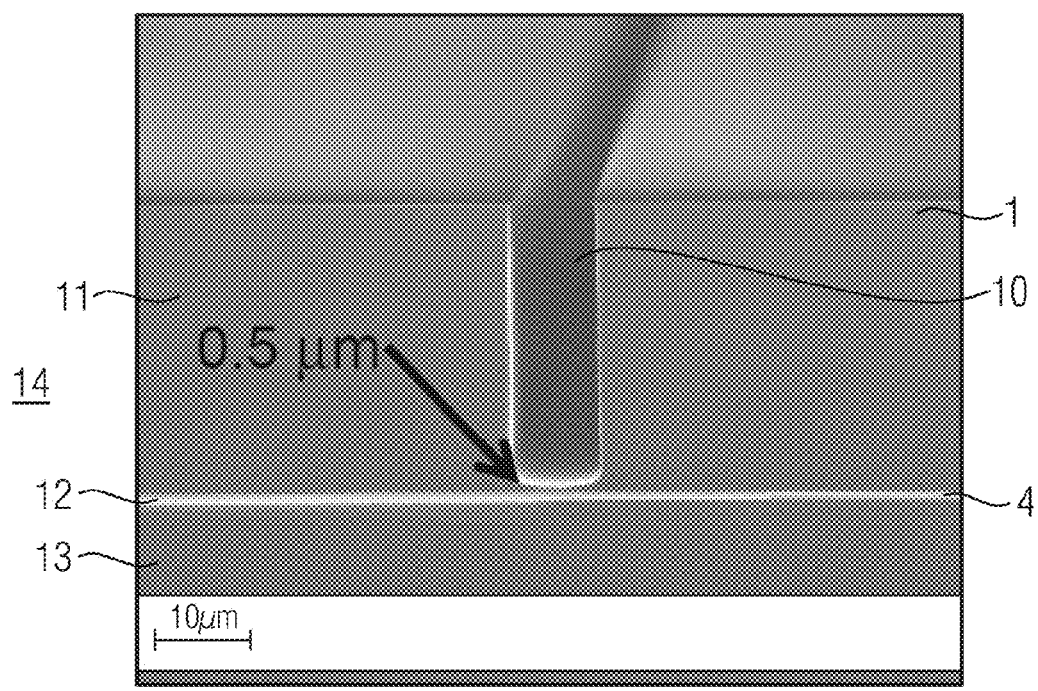
FIG. 22 is a SEM image illustrating a trench in SOI layer that has been manufactured by plasma etching in n− Si wafer.

FIG. 22 is a SEM image in which trench 10 in SOI layer 11 that has been manufactured by plasma etching is in n– Si wafer 14'.

Figure 23:
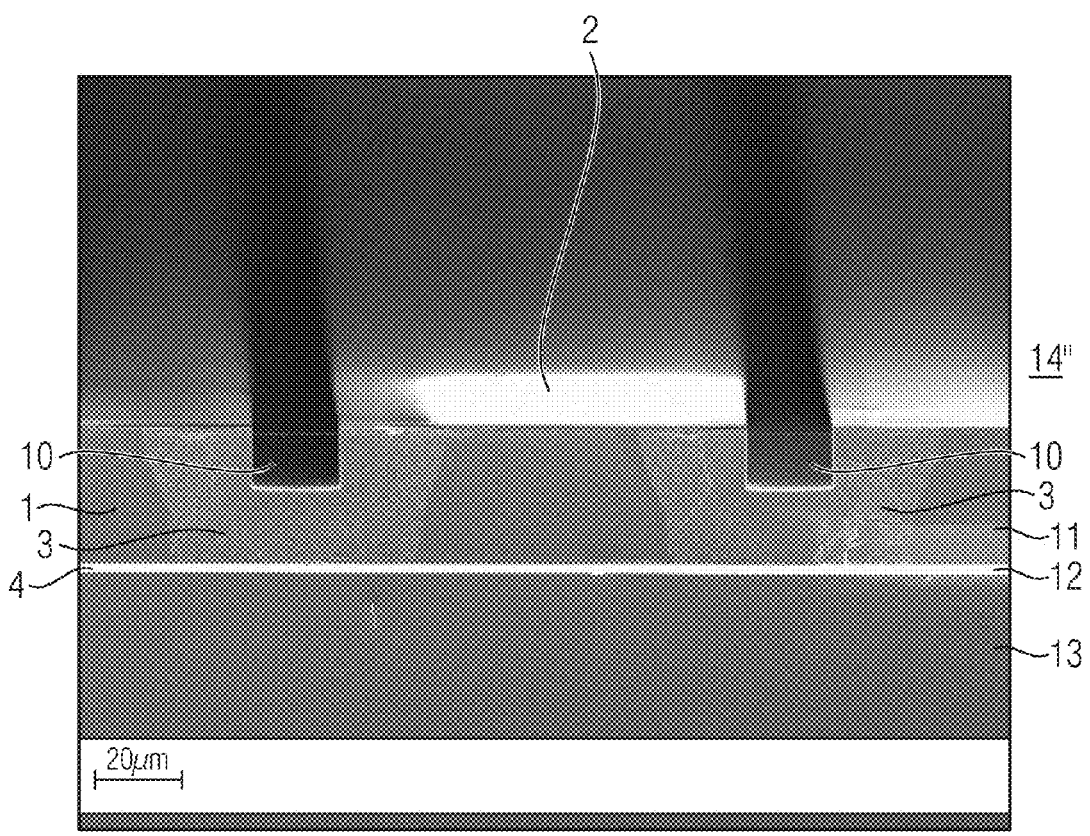
FIG. 23 is a SEM image illustrating a section of two parallel trenches in a highly doped n+ SOI wafer.

FIG. 23 is a SEM image illustrating a section of a cylindrical trench in a highly doped n+ SOI wafer. As can be seen, with plasma etching we are able to obtain vertical walls having almost rectangular shape. This helps us to manufacture well-defined porous silicon structures.

VI. The Supercapacitor and the Blank for the Same

Figure 24:
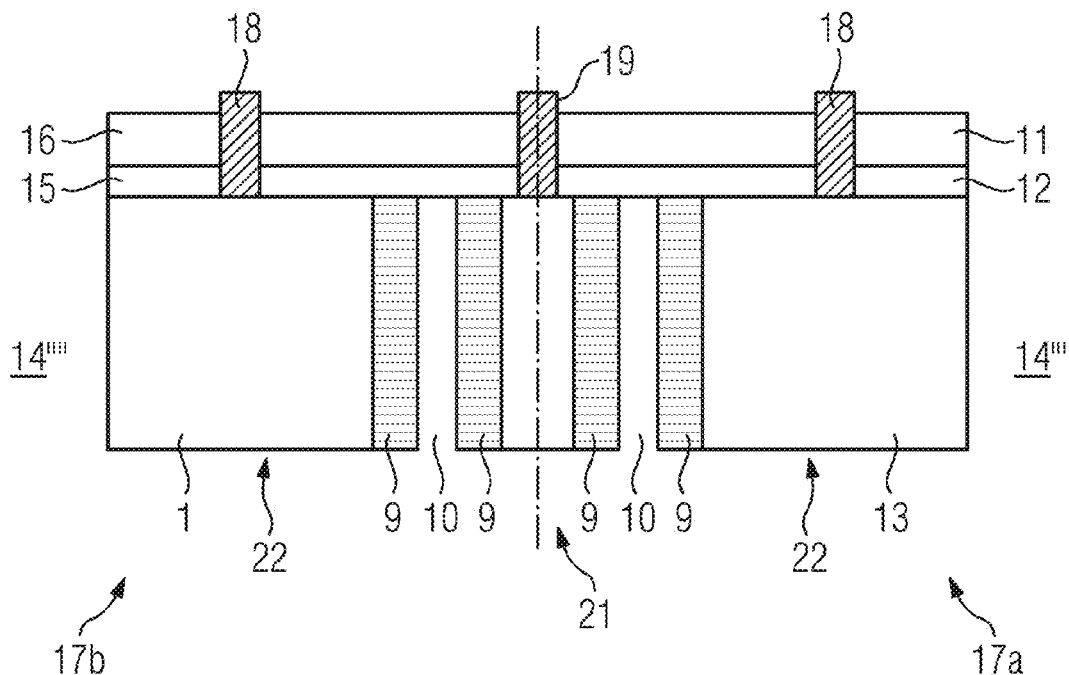
FIG. 24 illustrates the structure of two kinds of blanks that can be used to manufacture a supercapacitor.

FIG. 24 shows half of a section of a first blank 17a and half of a section of a second blank 17b. Both blanks 17a, 17b are our proof-of concept test devices.

Blank 17a is based on (n++ or p++ doped) DSP SOI wafer 14'''. The trench 10 has been formed by using the methods described above, and is limited at its bottom to the BOX layer. The porous silicon 3 has been coated with TiN by using ALD to form coated porous silicon 9.

Contacting points 18, 19 go through the BOX layer 12 and also the SOI layer 11 and therefore enable contacting in or on the SOI layer 11. This facilitates integrating the blank 17a to an in-chip structure that also comprises further microelectronic components.

Blank 17b which is an alternative to blank 17a, is based on (n++ or p++ doped) DSP Si wafer 14''''. As can be seen, the semiconductive silicon layer 1 is limited to SiN layer 15 which has LTO layer, a PSi layer, or a metal layer on top of it.

Figure 25:
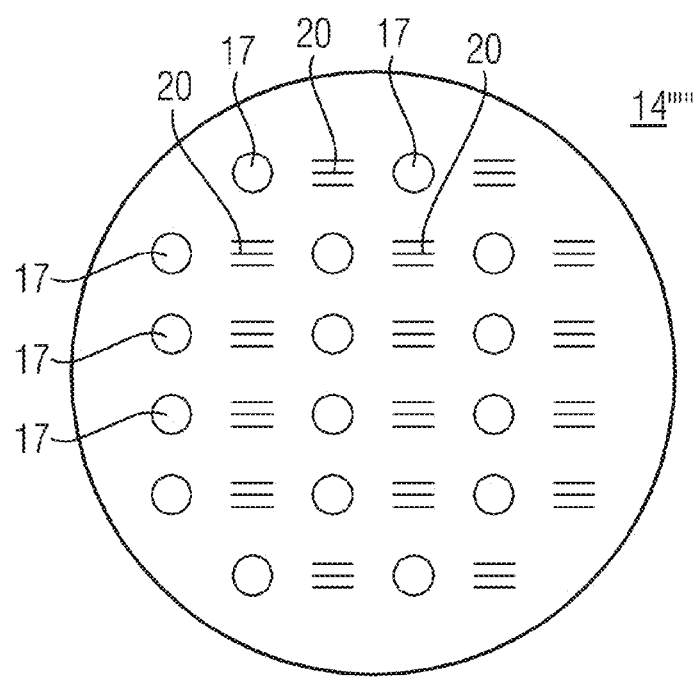
FIG. 25 illustrates trenches etched from the backside of a handle of a SOI wafer or into a DSP wafer with an insulator layer on top.

FIG. 25 illustrates trenches 10 etched from the backside of a handle wafer 14''''. The handle wafer 14'''' may in particular be n++ or p++ doped DSP SOI wafer '''' or highly doped n+ SOI wafer 14''.

The handle wafer 14'''' comprises a number of blanks 17 which may be blanks 17a. The handle wafer 14'''' may further comprise other microelectric components thank blanks 17.

Figure 26A:
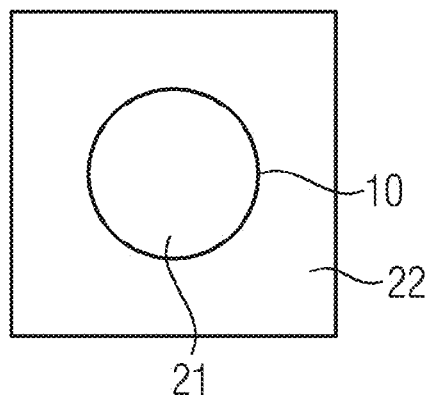
FIGS. 26a and 26b illustrate the handle wafer of FIG. 25 after cleaving into separate chips, from the handle side.
Figure 26B:
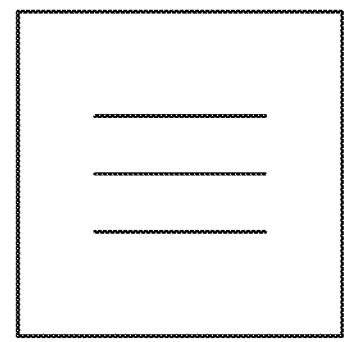
Figure 27A:
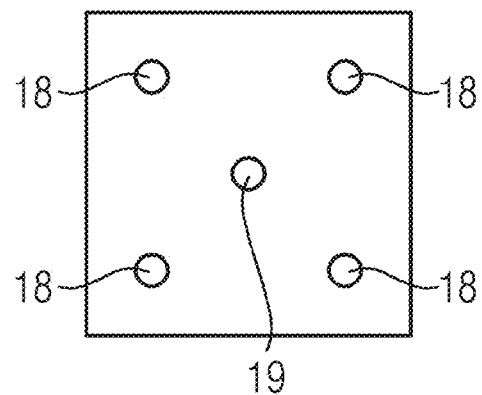
FIGS. 27a and 27b illustrate the handle wafer of FIG. 25 after cleaving into separate chips, from the SOI side.
Figure 27B:
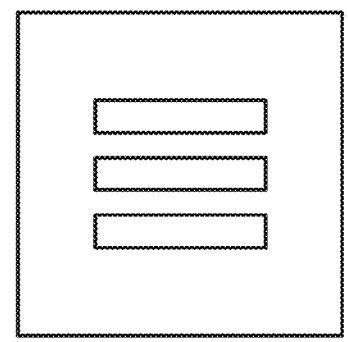

FIGS. 26a and 26b illustrate the handle wafer 14'''' after cleaving into separate chips (blanks 17 and other microelectric components 20), from the handle layer 13 side, and FIGS. 27a and 27b from the SOI layer 11 side, respectively.

As can be understood, the trench 10 divides the blank 17 in two volumes: first volume 22 which is laterally the outer volume surrounds second volume 21 which is laterally the inner volume.

Contacting points 18 (which may be in any number, from one to a very large number) are contacted to the first volume 22. Contacting points 19 (which may be in any number, from one to a very large number) are contacted to the second volume 21. By using a larger number of contacting points, charge transfer may be made more even within the volume of the supercapacitor 25.

Figure 28:
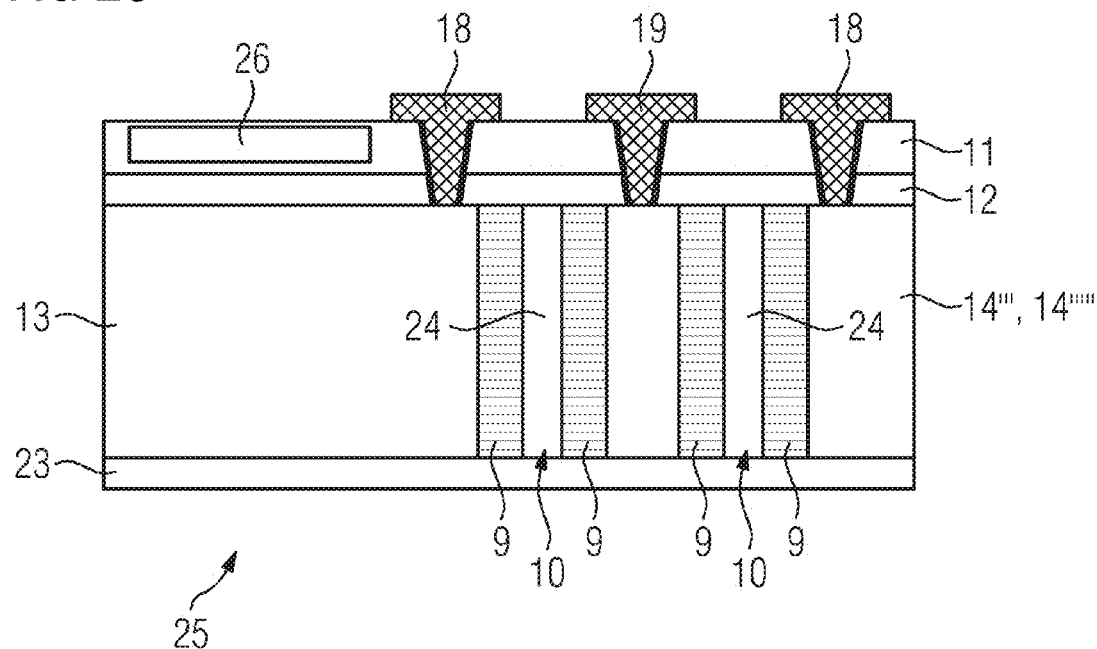
FIG. 28 illustrates a supercapacitor made from a first kind of blank.

FIG. 28 illustrates supercapacitor 25 that has been manufactured from blank 17a by adding electrolyte 24 into trench 10 and fastening 23 sealing lid to close the trench 10 from the top so that electrolyte 24 does not escape from the supercapacitor 29.

Figure 29:
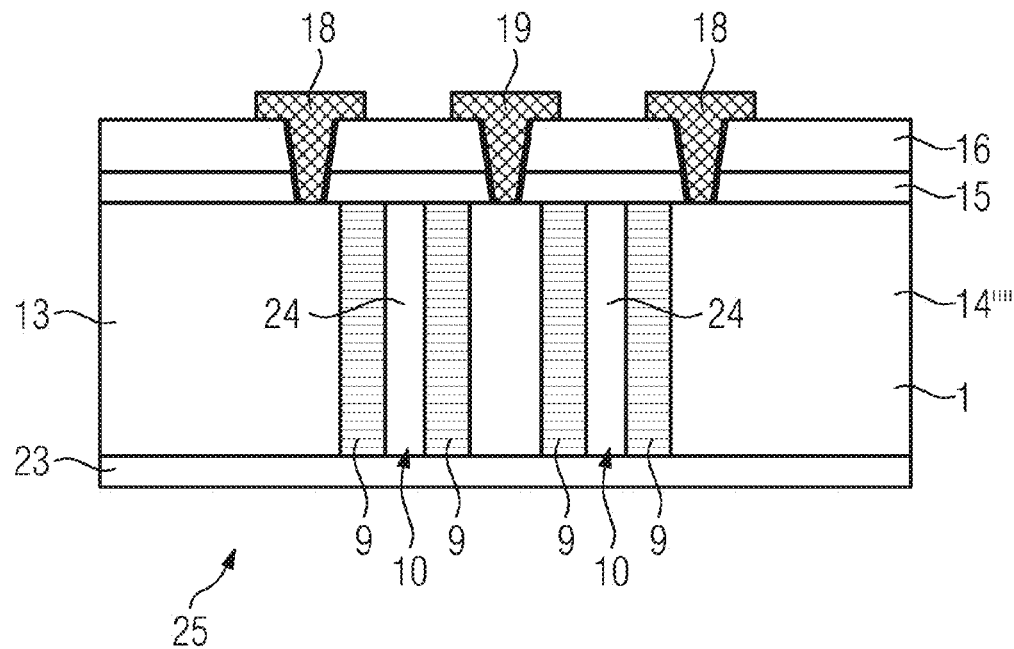
FIG. 29 illustrates a supercapacitor made from a second kind of blank.

FIG. 29 illustrates supercapacitor 25 that has been manufactured from blank 17b by adding electrolyte 24 into trench 10 and fastening 23 sealing lid to close the trench 10 from the top so that electrolyte 24 does not escape from the supercapacitor 25.

Both supercapacitors 25 may comprise further microelectronic devices 26. At least some of the microelectronic devices 26 are preferably in the SOI layer 26 of the supercapacitor 25 if the supercapacitor 25 has been manufactured from blank 17b.

Figure 30A:
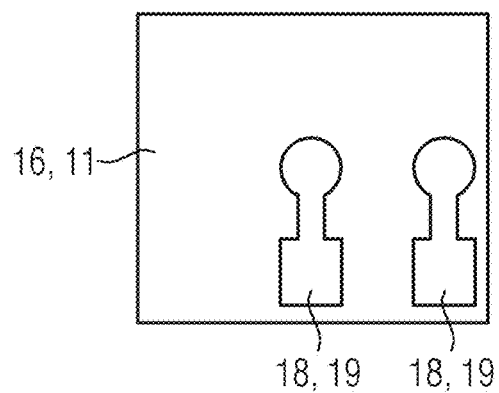
FIG. 30a illustrates contacting points as seen from top.
Figure 30B:
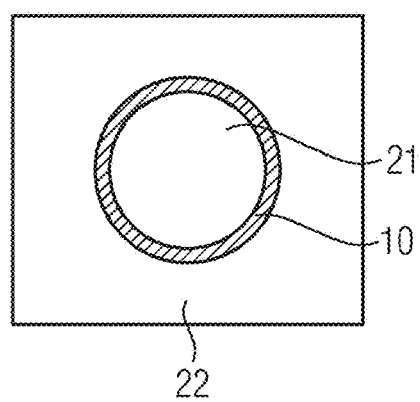
FIGS. 30b and 30c illustrate trench as seen from below.
Figure 30C:
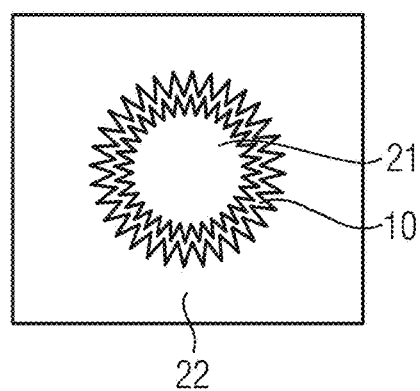

FIG. 30a illustrates contacting points 18, 19 as seen from top. They are surrounded by LTO/pSi/metal layer 16 or by SOI layer 11. FIGS. 30b and 30c illustrate trench 10 as seen from below, the trench 10 separating the first volume 22 (i.e. the laterally outer volume) from the second volume 21 (i.e. the laterally inner volume). The trench 10 may have any closed or non-closed shape, as explained above, provided that the porous semiconductor volumes on the opposite sides of the trench are electrically isolated from each other so that the electrodes of the supercapacitor will not be short-circuited.

VII. Selected Details of Our Samples and Methods

Figure 31:
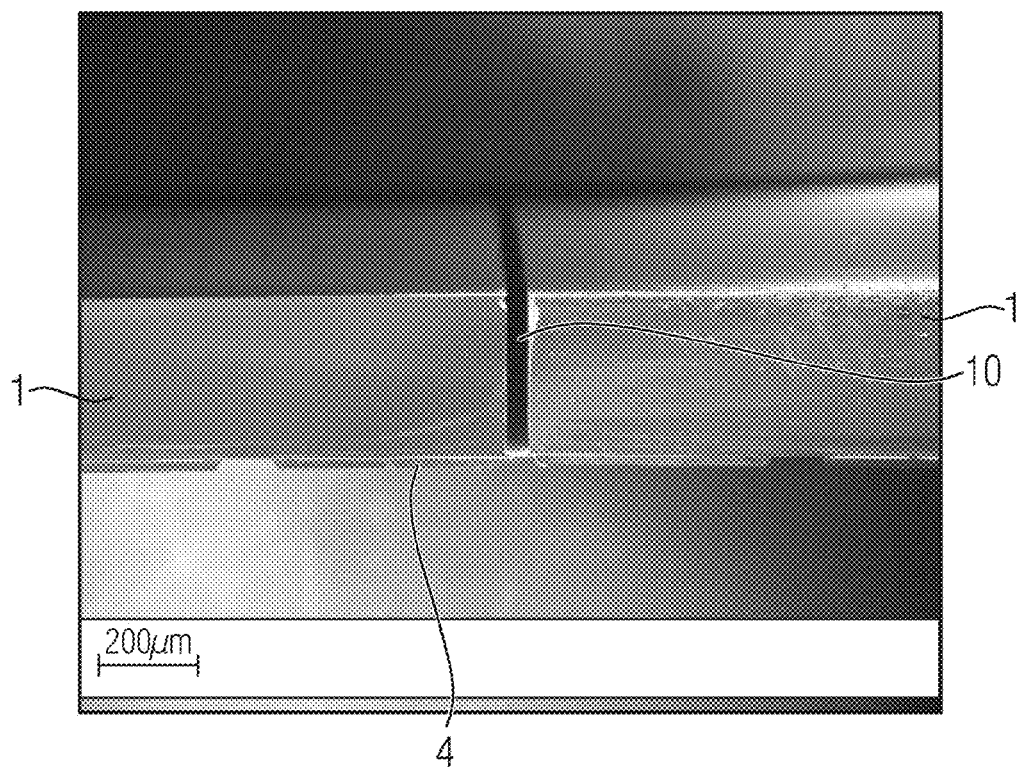
FIG. 31 is a SEM image illustrating deep etched trenches.
Figure 31:
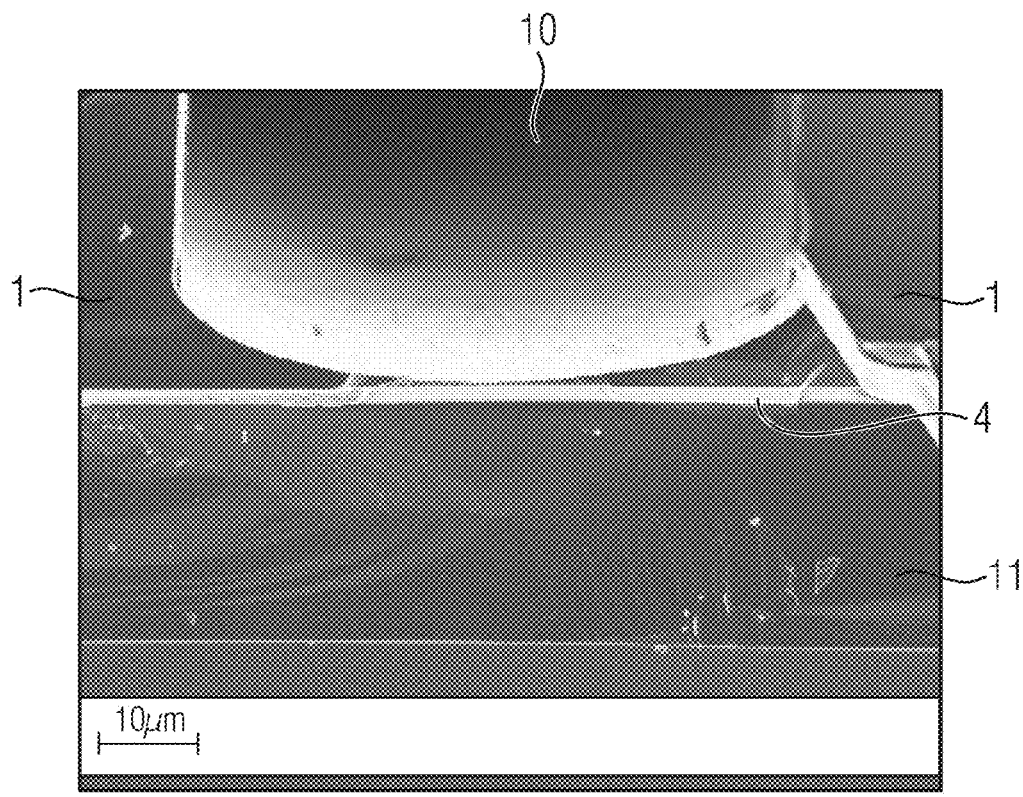

FIG. 31 is a SEM image of deep etched trenches 10 in semiconductive silicon layer 1. The image on the right side with larger magnification.

Figure 32:
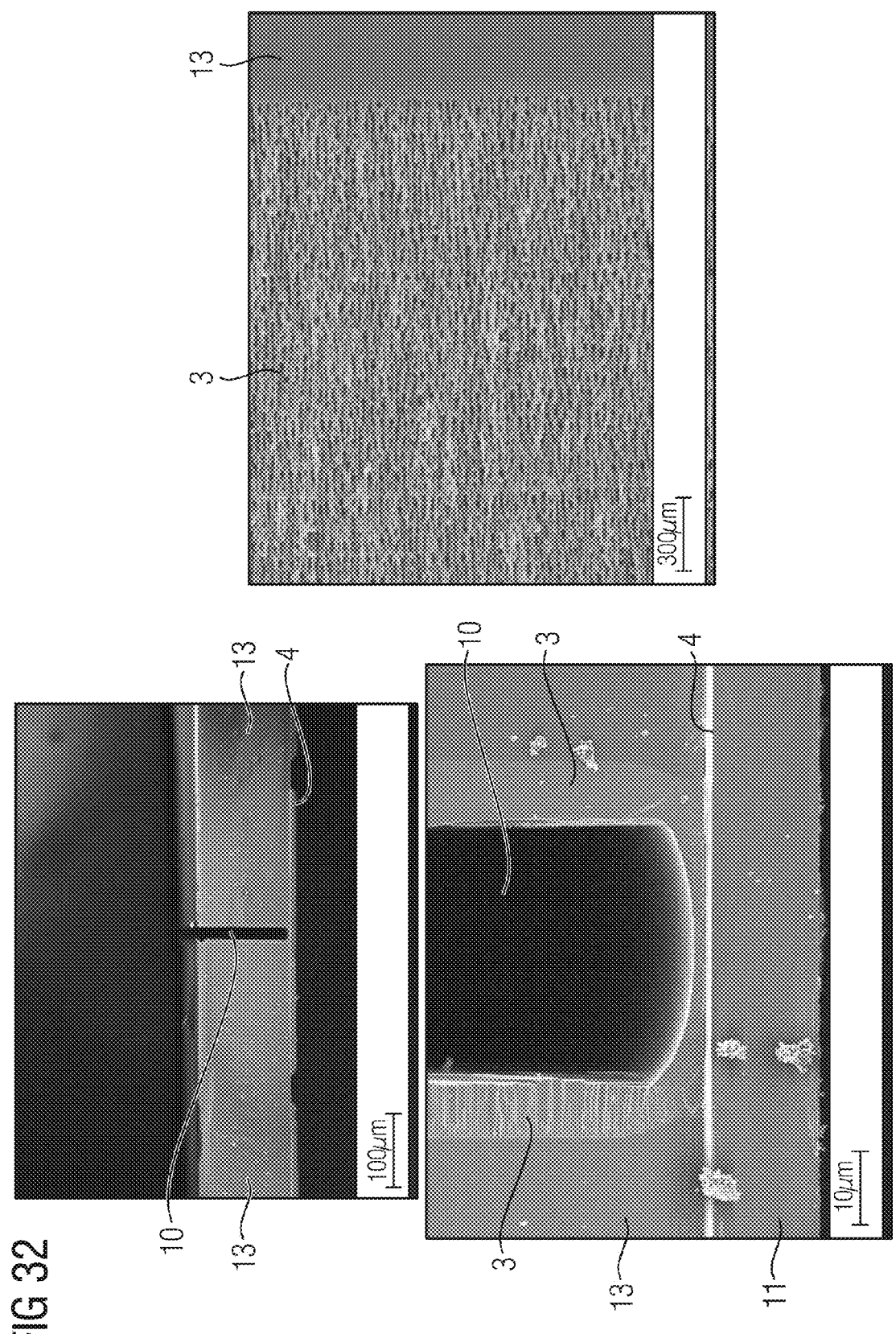
FIG. 32 is a SEM image illustrating formation of porous silicon.

FIG. 32 is a SEM image of deep etching the trench 10 in porous silicon 3. The image on left bottom is with a larger magnification and on the right side with still larger magnification. The trench 10 has been made in the handle layer 13 of a handle wafer 14''''.

Figure 33:
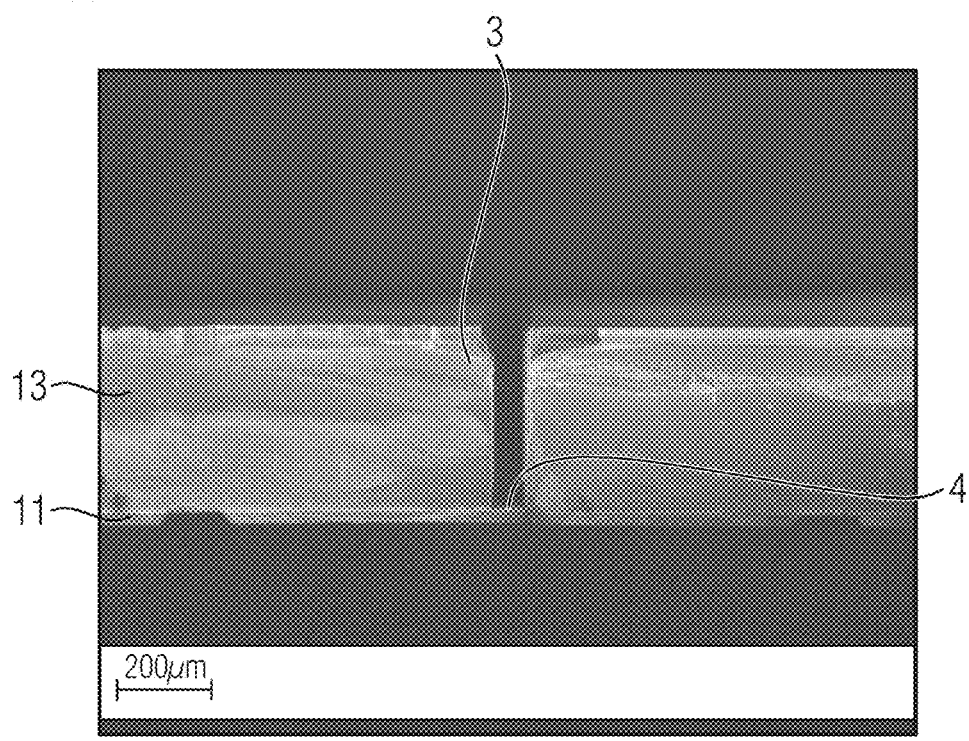
FIG. 33 is a SEM image illustrating removal of porous silicon from the bottom of the trenches.
Figure 33:
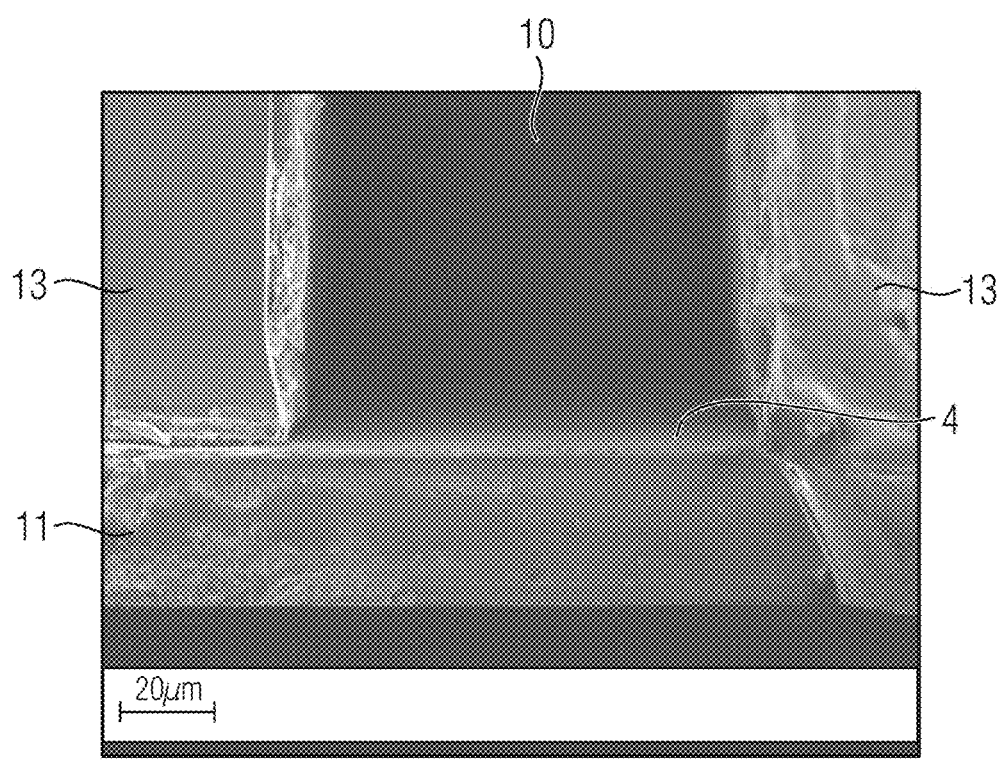

FIG. 33 illustrates removal of porous silicon 3 from the bottom of the trenches 10. Porous silicon may be need to be removed after etching, in particular if the bottom of trench 10 as shown FIG. 32 would not suffice.

Figure 34:
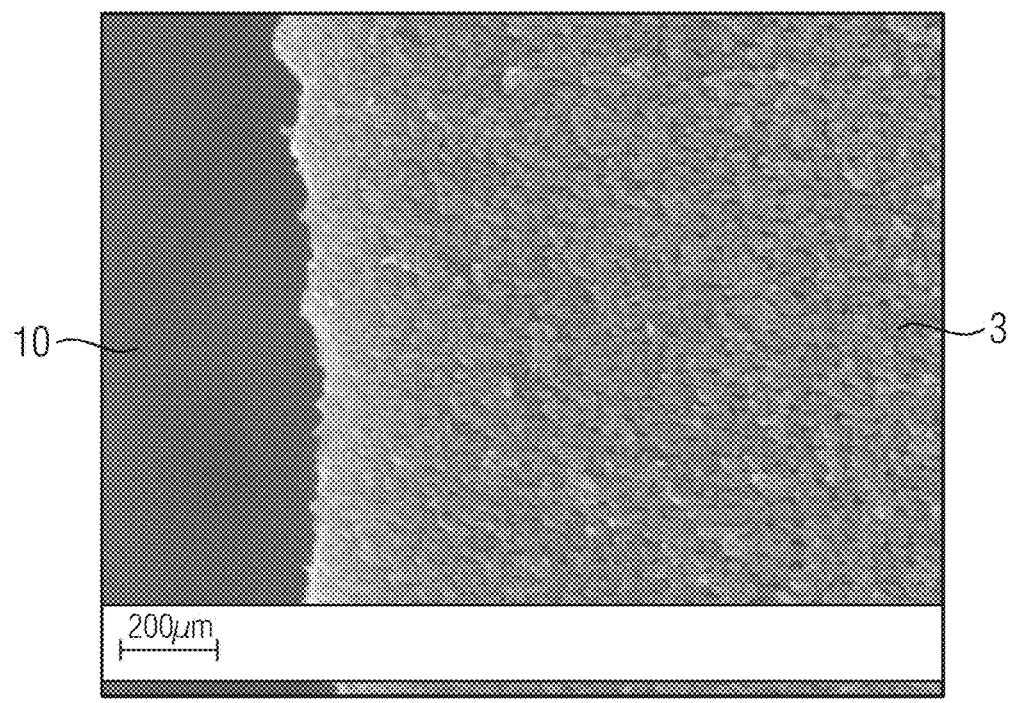
FIG. 34 is a SEM image of porous silicon showing the sidewalls of the trench.
Figure 34:
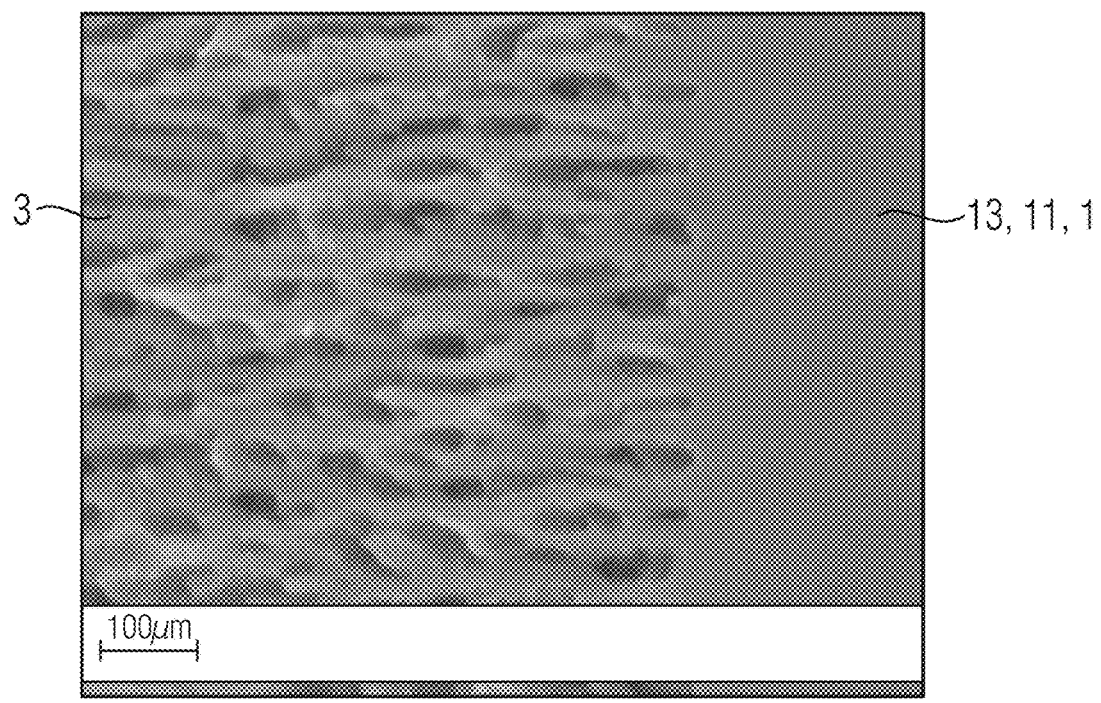

FIG. 34 illustrates porous silicon 3 on the sidewalls of the trench 10 and at the end of the channels i.e. at the interface of porous silicon 3 and semiconductive silicon layer 1 (such as, the SOI layer 11).

Figure 35:
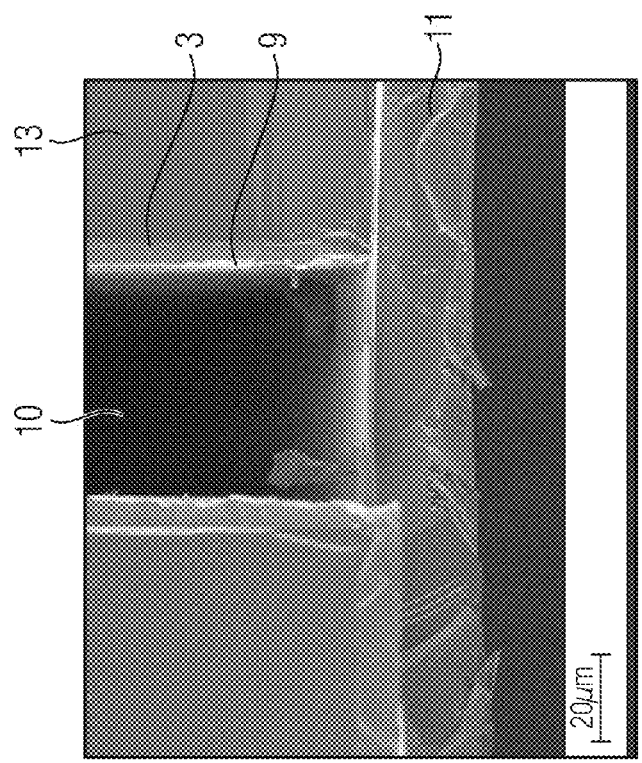
FIG. 35 is a set of SEM images illustrating deposition of TiN by atomic layer deposition.
Figure 35:
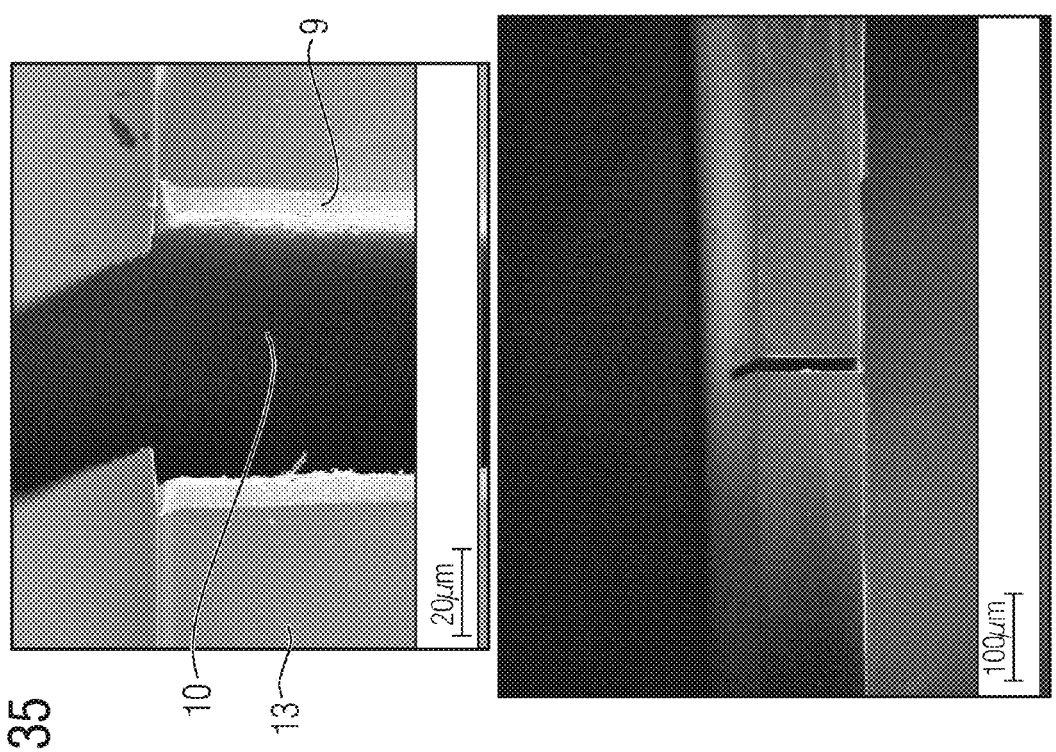

FIG. 35 illustrates deposition of TiN by atomic layer deposition. The image on the bottom is with larger magnification and the third image with even larger magnification. The sidewalls of trench 10 are coated with TiN (i.e. coated porous silicon 9).

Figure 36:
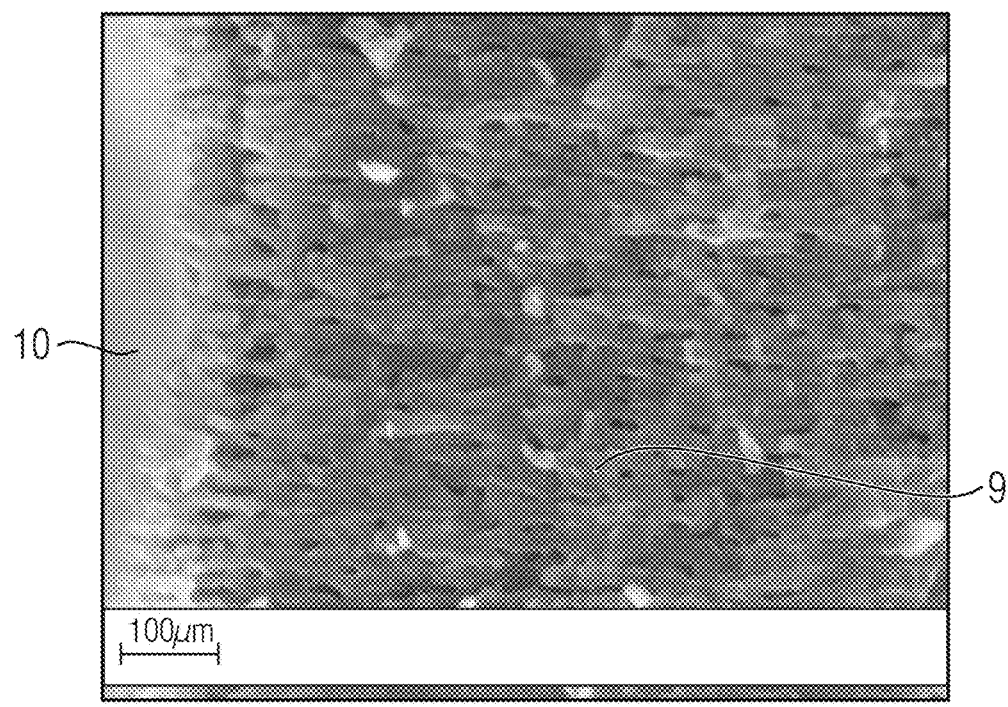
FIG. 36 is a set of SEM images illustrating TiN coated porous silicon.
Figure 36:
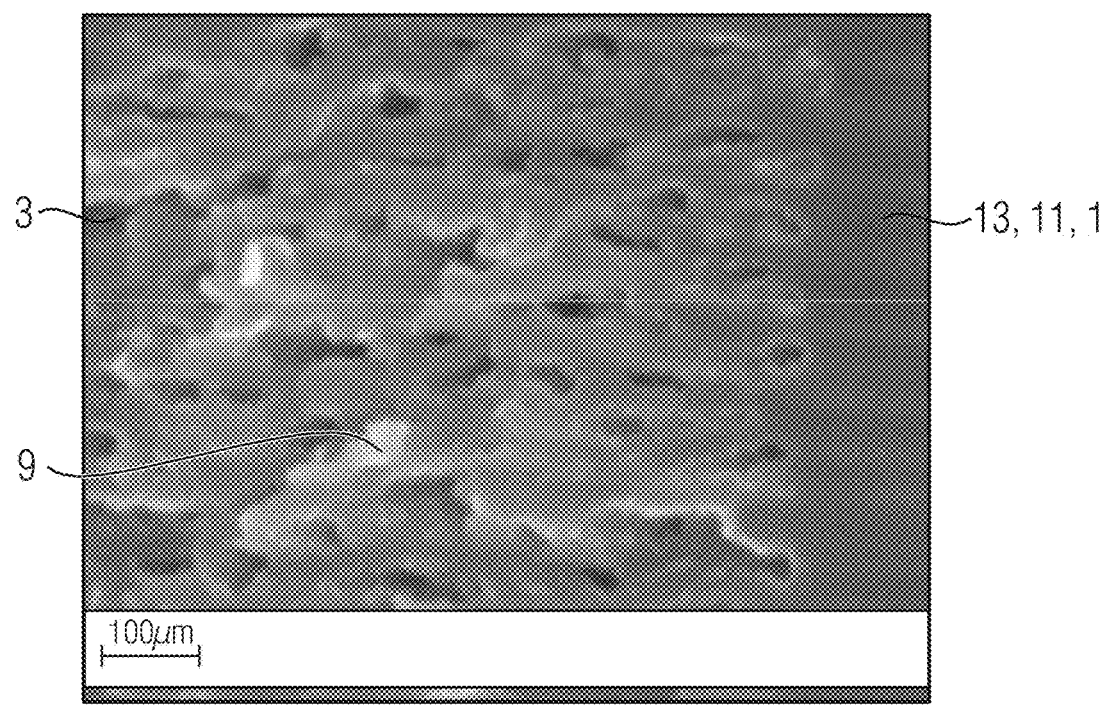

FIG. 36 is a SEM image of TiN coated PS as in FIG. 35 in still larger magnification.

Figure 37A:
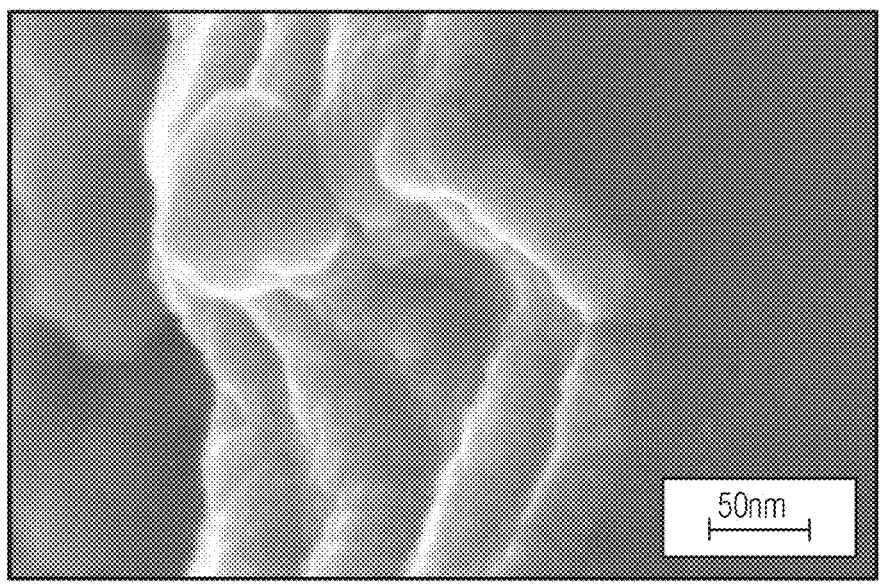
FIG. 37a to 37d are SEM image illustrating removal of TiN from the bottom of the trench.
Figure 37B:
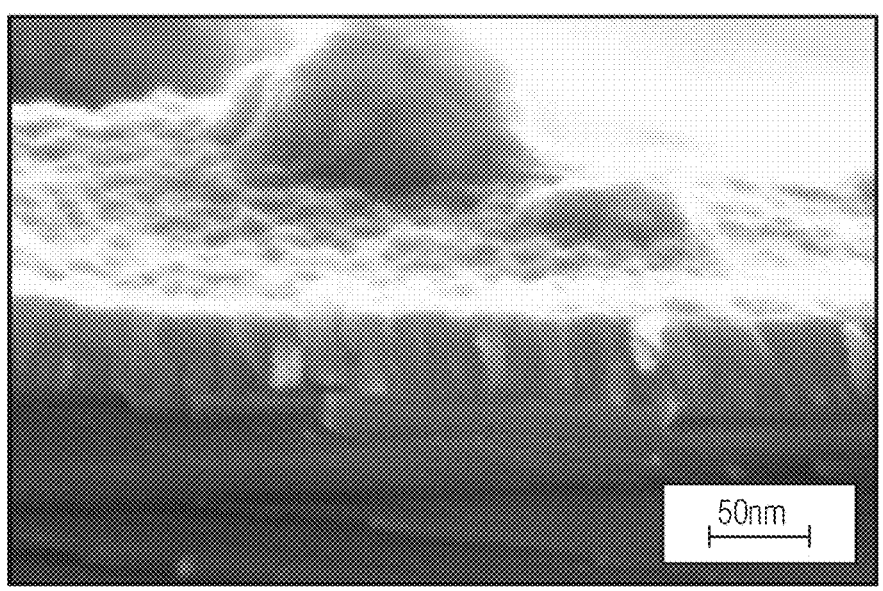
Figure 37C:
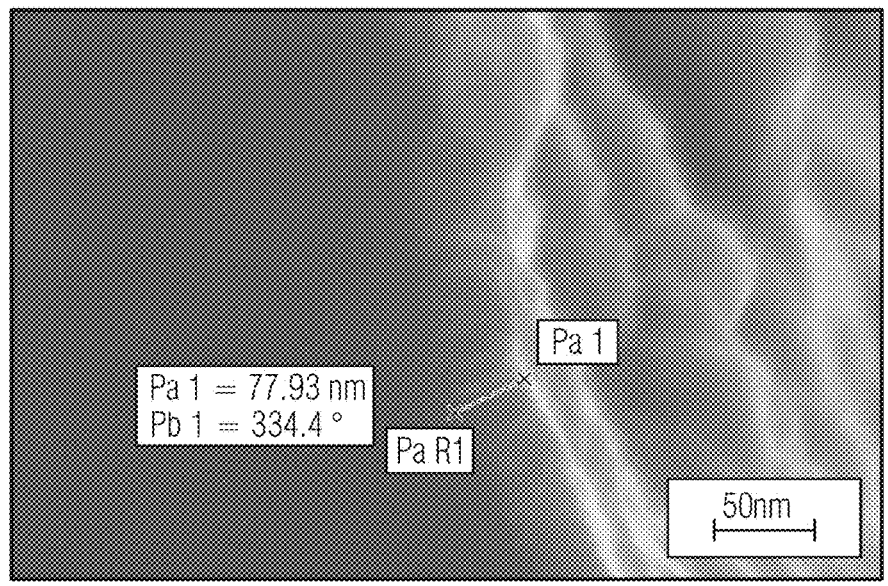
Figure 37D:
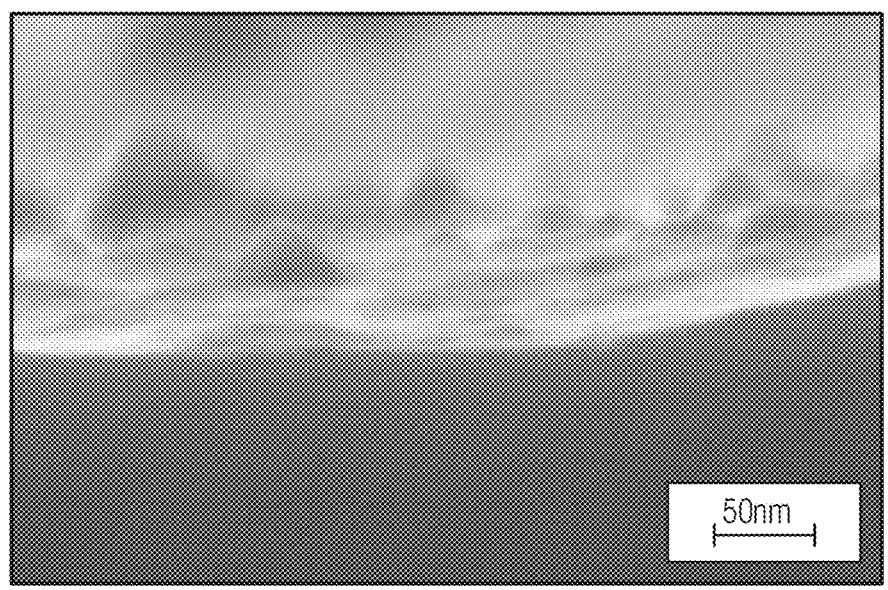
Figure 38:
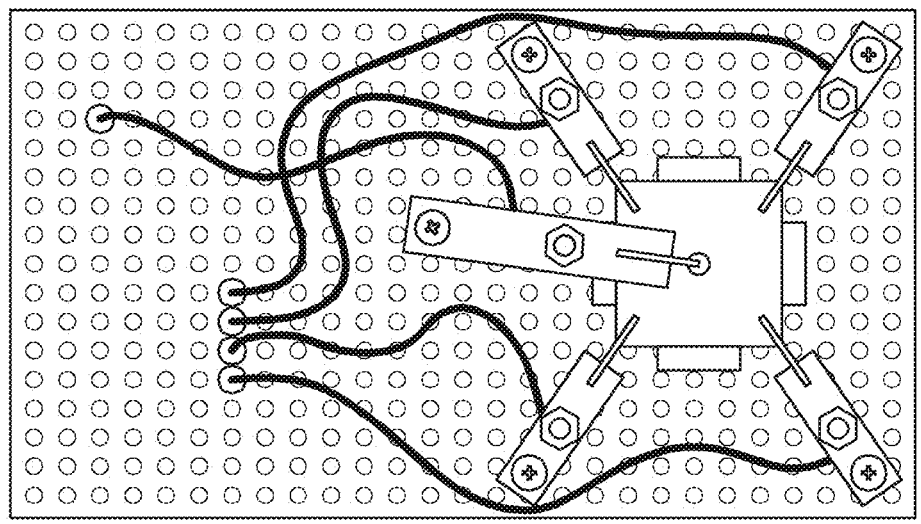
FIG. 38 illustrates the sample holder we used to carry out the measurements.

FIG. 37a to 37d illustrate removal of TiN from the bottom of the trench 10. FIG. 37a illustrates the trench sidewall and FIG. 37b the trench bottom with about 78 nm TiN layer. FIG. 37c illustrates the trench sidewall and FIG. 37d the trench bottom after TiN has been removed from the bottom of the trench 10 by plasma etching FIG. 38 illustrates a sample holder used to carry out the measurements; and FIGS. 39a and 39b illustrate measured cyclic voltammetry curves of certain supercapacitors that were made inside a silicon wafer.

Figure 39A:
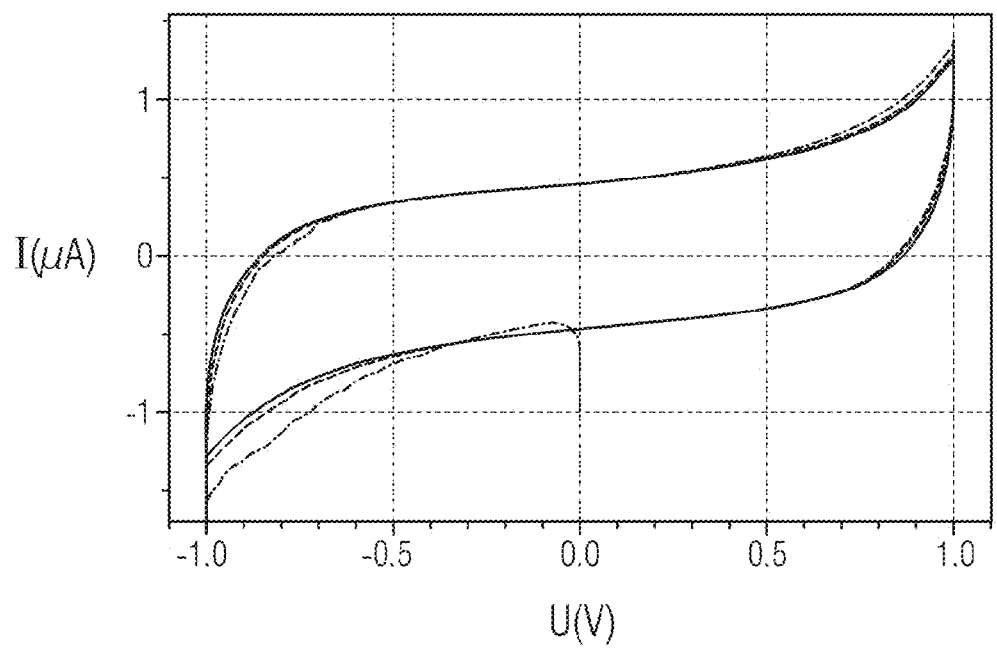
FIGS. 39a and 39b illustrate measured cyclic voltammetry curves of the supercapacitors.

FIG. 39a shows the measurement results of supercapacitor with ALD TiN coating and without the porous silicon volumes. The supercapacitor has a capacitance of 4 µF.

Figure 39B:
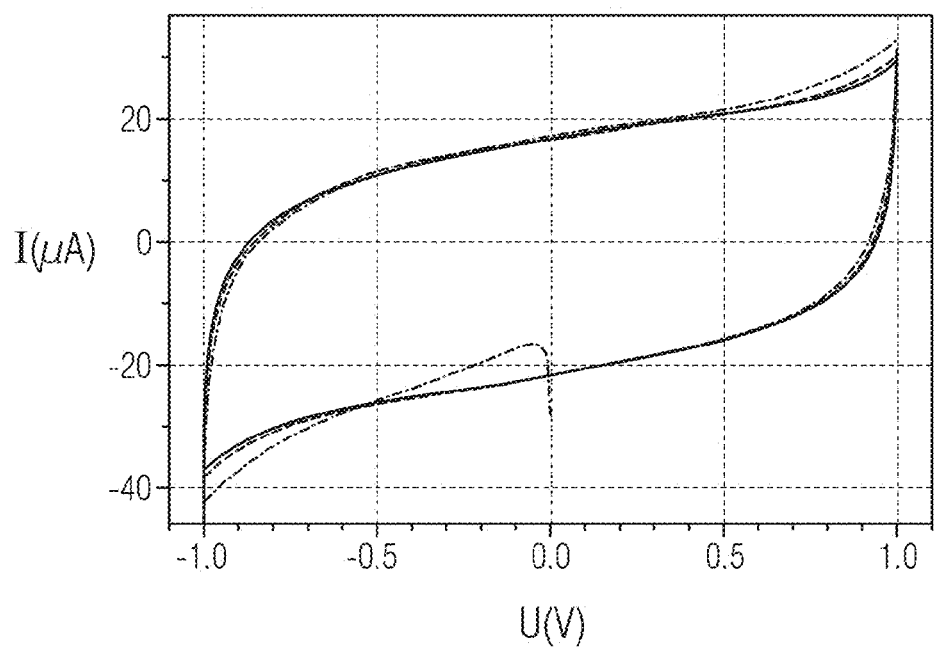

FIG. 39b shows the measurement results of supercapacitor with ALD TiN coating and with the porous silicon volumes. The supercapacitor 25 has a capacitance of 140 µF.

To summarize, supercapacitor 25 according to our invention may open new possibilities for miniaturized and integrated energy storage. Electrochemical double layer capacitors (EDLC), commonly called as supercapacitors, offer an attractive possibility for short term high power energy storage that could be utilised also in miniaturized devices. On-chip or in-chip integration of supercapacitor elements by utilising large-area silicon nanostructures, like porous silicon (PS), may provide a scalable on-chip solution. Even though pristine PS-electrolyte interface exhibits poor electrical characteristics and stability and the high resistance of PS limits the power extraction leading to performance that is significantly below that of carbon based on-chip supercapacitors, we in the work underlying this patent application were able to demonstrate a new Si-based hybrid nanomaterial for supercapacitor electrodes that reaches the performance of the best graphene electrodes and can be applied for scalable on-chip energy storage. Such performance is obtained by coating PS with an ultra-thin titanium nitride layer by atomic layer deposition (ALD) technique. PS enables the large effective area for these TiN-PS hybrid electrodes leading to very high specific capacitance (~4140 $\mu Fcm^{-3}$) and energy density (4.5 $Jcm^{-3}$) values. Due to low resistivity and chemical stability of the TiN layer our approach also provides high power density (up to 500 $Wcm^{-3}$) and excellent stability in operation (more than 13,000 cycles).

The invention should not be understood as being limited only to the attached claims, but should be understood as including all their legal equivalents.

Even though the methods, devices and structures have above been described by using TiN as coating, we currently believe that there might be further suitable material candidates. Such candidates include: NbN and electrically conducting oxides.

As electrolyte 24, instead or in addition to water-based electrolytes or organic (liquid) electrolytes, a solid electrolyte, such as $TiO_2$ may be used. The in-wafer supercapacitors can be easily connected in series or parallel to vary the voltage or total capacitance.

LIST OF REFERENCE NUMERALS USED 1 semiconductive silicon layer
2 mask
3 porous silicon
4 electrically insulating layer
5 SOI wafer
6 silicon chip
7 polydimethylsiloxane (PDMS) layer
8 sample
9 coated porous silicon
10 trench
11 SOI layer
12 BOX layer
13 handle layer
14 n+ Si wafer
14' n− Si wafer
14" highly doped n+ SOI wafer
14'" n++ or p++ doped DSP SOI wafer
14"" n++ or p++ doped DSP Si wafer
14'"" handle wafer
15 electrically insulating layer, preferably a silicon nitride ($Si_3N_4$) layer
16 LTO/pSi/metal layer
17a blank (based on a DSP SOI wafer)
17b blank (based on a DSP Si wafer)
17 blank
18, 19 contacting points
20 other microelectric components
21 second volume (laterally inner volume)
22 first volume (laterally outer volume)
23 sealing lid
24 electrolyte
25 supercapacitor
26 microelectronic devices

The invention claimed is:

1. A blank suitable for use as a body of a supercapacitor comprising:
a first porous semiconductor volume and a second porous semiconductor volume, the second porous semiconductor volume being separated from the first porous semiconductor volume by a trench that is suitable for receiving an electrolyte, wherein the first and second porous semiconductor volume comprise channels opening to the trench, the second porous semiconductor volume is laterally surrounded by the first porous semiconductor volume and the trench forms a closed form.

2. The blank according to claim 1, wherein the first porous semiconductor volume and the second porous semiconductor volume are in the same semiconductor layer and wherein the first and second porous semiconductor volumes extend throughout the height of the layer.

3. The blank according to claim 1, wherein the side edge of the trench of the first porous semiconductor volume and the side edge of the trench of the second porous semiconductor volume each form at least one electrode.

4. The blank according to claim 3, wherein at least one, both or all of the electrodes has/have been at least partially coated the respective edges so that they are or comprise coated porous semiconductor.

5. The blank according to claim 4, wherein the coating has been carried out by using atomic layer deposition or any other method for producing conformal layers.

6. The blank according to claim 4, wherein the coating is or comprises TiN, NbN or at least one electrically conducting oxide or metal.

7. The blank according to claim 1, wherein the first porous semiconductor volume and the second porous semiconductor volume are or comprise silicon.

8. The blank according to claim 1, further comprising an insulating layer limiting to the bottom of the first porous semiconductor volume and of the second porous semiconductor volume, and to the bottom of the trench.

9. The blank according to claim 8, wherein the insulating layer is or comprises a buried oxide layer and/or consists of semiconductor oxide and/or comprises an electrically insulating layer that in particular may be a silicon nitride layer.

10. The blank according to claim 1, wherein the blank is in a single or double side polished silicon wafer and the first porous semiconductor volume and the second porous semiconductor volume have been formed in a semiconductive silicon layer, wherein the single or double side polished silicon wafer may be n++ or p++ doped.

11. The blank according to claim 10, wherein the trench is from below limited by a silicon nitride layer or a BOX layer which acts as a sealing.

12. The blank according to claim 1, wherein:
a) the blank is in a single or double side polished silicon-on-insulator wafer and the first porous semiconductor volume and the second porous semiconductor volume have been formed in the handle layer, whereby the single or double side polished silicon-on-insulator wafer may be n++ or p++ doped;
or
b) the blank is in a single or double side polished silicon wafer that is a silicon-on-insulator wafer comprising a silicon-on-insulator layer, and located on the side opposite to the silicon-on-insulator layer.

13. A supercapacitor comprising a body formed by using a blank comprising a first porous semiconductor volume and a second porous semiconductor volume, the second porous semiconductor volume being separated from the first porous semiconductor volume by a trench that is suitable for receiving an electrolyte, wherein the first and second porous semiconductor volume comprise channels opening to the trench, the second porous semiconductor volume is laterally surrounded by the first porous semiconductor volume, the trench forms a closed form, and wherein the first porous semiconductor volume acts as one electrode and the second porous semiconductor volume acts as another electrode, with an electrolyte in the trench.

14. The supercapacitor according to claim 13, further comprising electrical contacting points to the electrodes that have been made through a layer that is immediately below the trench.

15. The supercapacitor according to claim 13, further comprising a sealing lid for sealing the trench, preferably configured to seal the trench only from the top.

16. The supercapacitor according to claim 13, wherein the supercapacitor is a separatorless supercapacitor in which there is no intervening separator or separator in the trench but the trench itself acts as a separator.

* * * * *